(12) United States Patent
Yanagisawa

(10) Patent No.: US 10,355,003 B2
(45) Date of Patent: Jul. 16, 2019

(54) ANTI-FUSES MEMORY CELL AND MEMORY APPARATUS

(71) Applicant: SONY CORPORATION, Tokyo (JP)

(72) Inventor: Yuki Yanagisawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/540,733

(22) PCT Filed: Nov. 27, 2015

(86) PCT No.: PCT/JP2015/083446
§ 371 (c)(1),
(2) Date: Jun. 29, 2017

(87) PCT Pub. No.: WO2016/117225
PCT Pub. Date: Jul. 28, 2016

(65) Prior Publication Data
US 2018/0019247 A1    Jan. 18, 2018

(30) Foreign Application Priority Data

Jan. 20, 2015  (JP) ................ 2015-008603

(51) Int. Cl.
*H01L 27/12* (2006.01)
*G11C 17/16* (2006.01)
(Continued)

(52) U.S. Cl.
CPC ........ *H01L 27/11206* (2013.01); *G11C 17/16* (2013.01); *G11C 17/165* (2013.01);
(Continued)

(58) Field of Classification Search
CPC ....... G11C 17/165; G11C 17/18; G11C 17/16; G11C 2013/008; G11C 2013/74;
(Continued)

(56) References Cited

U.S. PATENT DOCUMENTS 5,099,149 A  *  3/1992  Smith ................. G11C 17/18
                                                      326/38
8,236,634 B1 *  8/2012  Kanike ............... H01L 27/1211
                                                      257/E21.431
(Continued)

FOREIGN PATENT DOCUMENTS

JP       10-178098 A    6/1998
JP       2006-510203 A  3/2006
(Continued)

OTHER PUBLICATIONS

International Search Report and Written Opinion of PCT Application No. PCT/JP2015/083446, dated Feb. 16, 2016, 3 pages of English Translation and 10 pages of ISRWO.

*Primary Examiner* — Sung Il Cho
(74) *Attorney, Agent, or Firm* — Chip Law Group

(57) ABSTRACT

A memory cell of the present disclosure includes: anti-fuses that are respectively inserted into a plurality of paths, one ends of the respective plurality of paths being coupled to one another; a resistor that is inserted into one or more of the plurality of paths; and a selection transistor that is turned on to couple a first coupling terminal to the one ends of the respective paths.

19 Claims, 15 Drawing Sheets

(51) Int. Cl.
  *H01L 27/112* (2006.01)
  *H01L 45/00* (2006.01)
  *G11C 17/18* (2006.01)
  *G11C 13/00* (2006.01)

(52) U.S. Cl.
  CPC .......... *H01L 45/04* (2013.01); *H01L 45/1226* (2013.01); *H01L 45/148* (2013.01); *G11C 17/18* (2013.01); *G11C 2013/008* (2013.01); *G11C 2213/74* (2013.01); *G11C 2213/76* (2013.01); *G11C 2213/78* (2013.01); *G11C 2213/79* (2013.01); *G11C 2213/82* (2013.01); *H01L 27/1203* (2013.01)

(58) Field of Classification Search
  CPC ............ G11C 2013/76; G11C 2013/78; G11C 2013/79; G11C 2013/82; H01L 27/11206; H01L 27/1203; H01L 45/04; H01L 45/1226; H01L 45/148
  USPC .......................................................... 365/96
  See application file for complete search history.

(56) References Cited

U.S. PATENT DOCUMENTS

| | | | | |
|---|---|---|---|---|
| 8,339,830 | B2* | 12/2012 | Yamauchi | G11C 11/5692 365/200 |
| 2003/0218924 | A1* | 11/2003 | Duval | G11C 17/18 365/200 |
| 2004/0232446 | A1* | 11/2004 | Nishimura | G01R 31/2884 257/202 |
| 2006/0158923 | A1* | 7/2006 | Namekawa | G11C 5/145 365/149 |
| 2006/0291316 | A1* | 12/2006 | Jenne | G11C 17/16 365/225.7 |
| 2007/0058473 | A1* | 3/2007 | Kouchi | G11C 17/16 365/225.7 |
| 2009/0102511 | A1* | 4/2009 | Hirose | H03K 19/0005 326/30 |
| 2010/0220517 | A1* | 9/2010 | Okayama | G11C 7/20 365/158 |
| 2011/0058402 | A1* | 3/2011 | Kubouchi | G11C 17/18 365/96 |
| 2012/0051154 | A1* | 3/2012 | Son | G11C 17/16 365/189.07 |
| 2012/0104545 | A1* | 5/2012 | Takeshima | H01L 23/5252 257/530 |
| 2012/0212992 | A1* | 8/2012 | Kanematsu | G11C 17/16 365/103 |
| 2014/0078223 | A1* | 3/2014 | Ohmura | B41J 2/14016 347/56 |
| 2015/0003142 | A1* | 1/2015 | Chung | G11C 29/027 365/96 |

FOREIGN PATENT DOCUMENTS

| | | |
|---|---|---|
| JP | 2012-174863 A | 9/2012 |
| JP | 2012-203954 A | 10/2012 |

\* cited by examiner

[ FIG. 1 ]
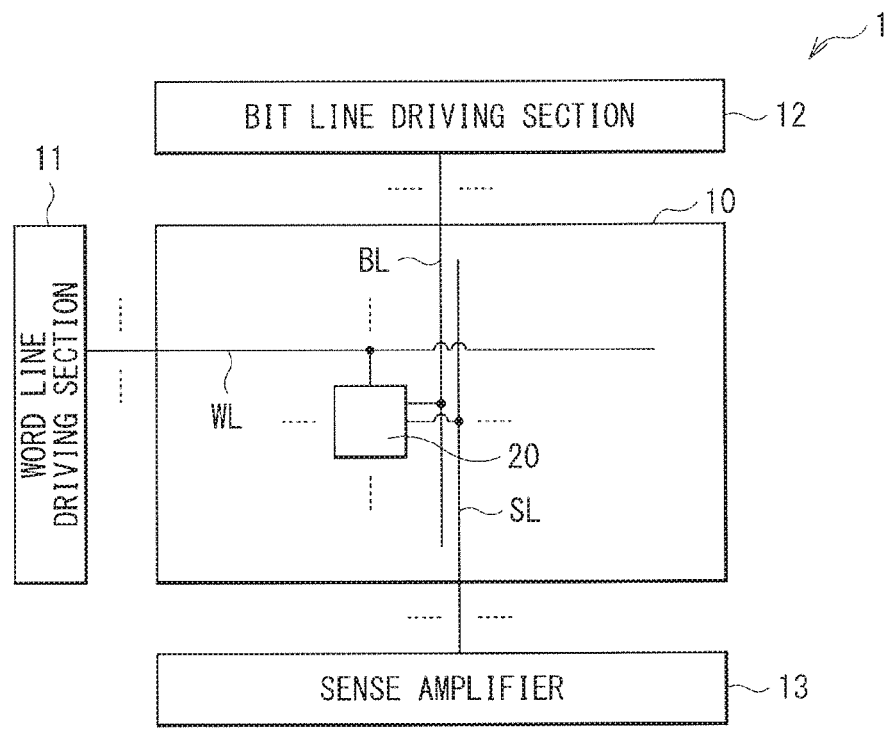
[ FIG. 2 ]
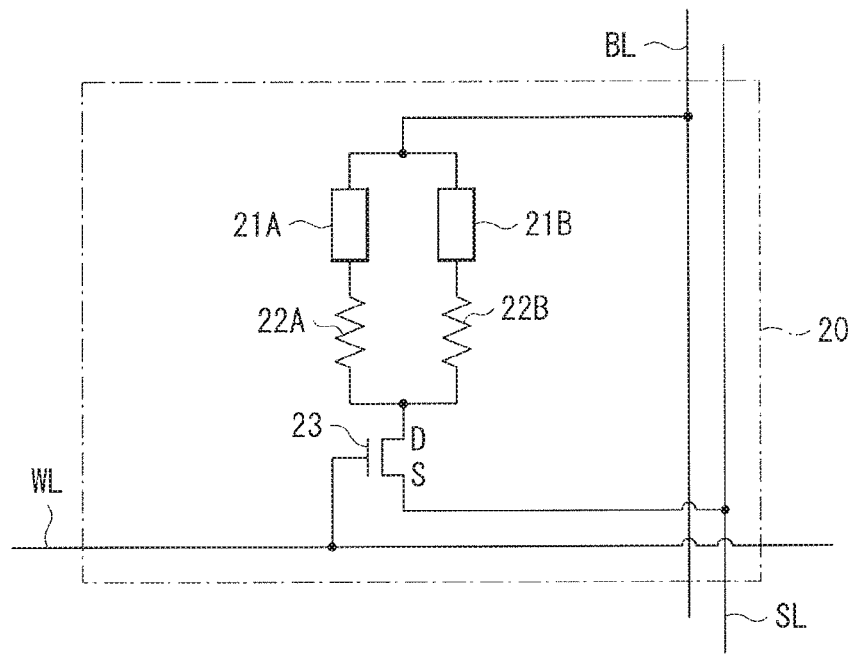

[FIG. 3A]
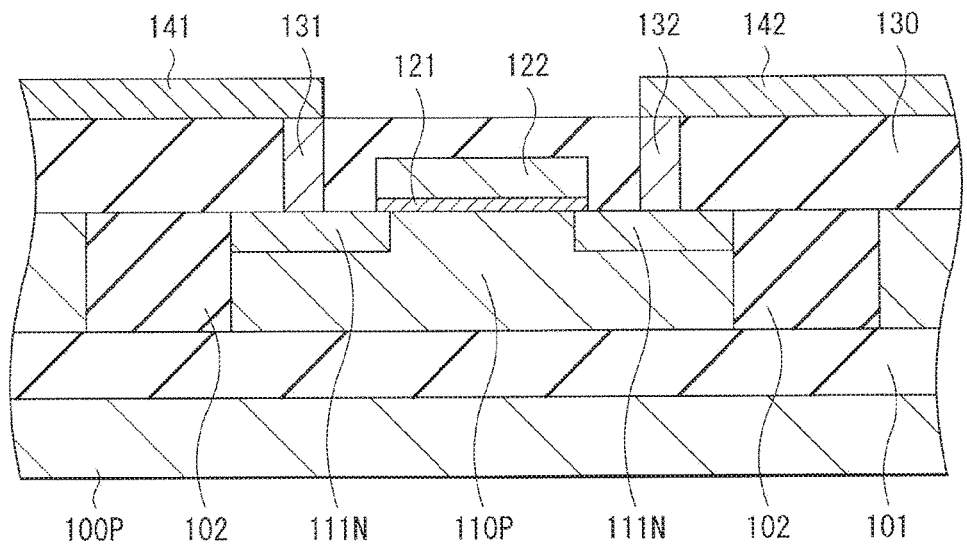
[FIG. 3B]
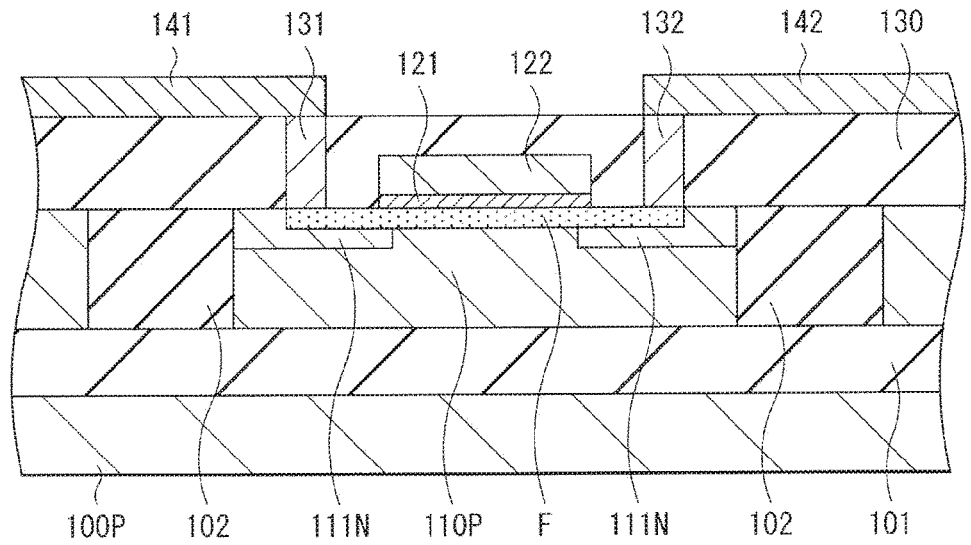

[ FIG. 4 ]
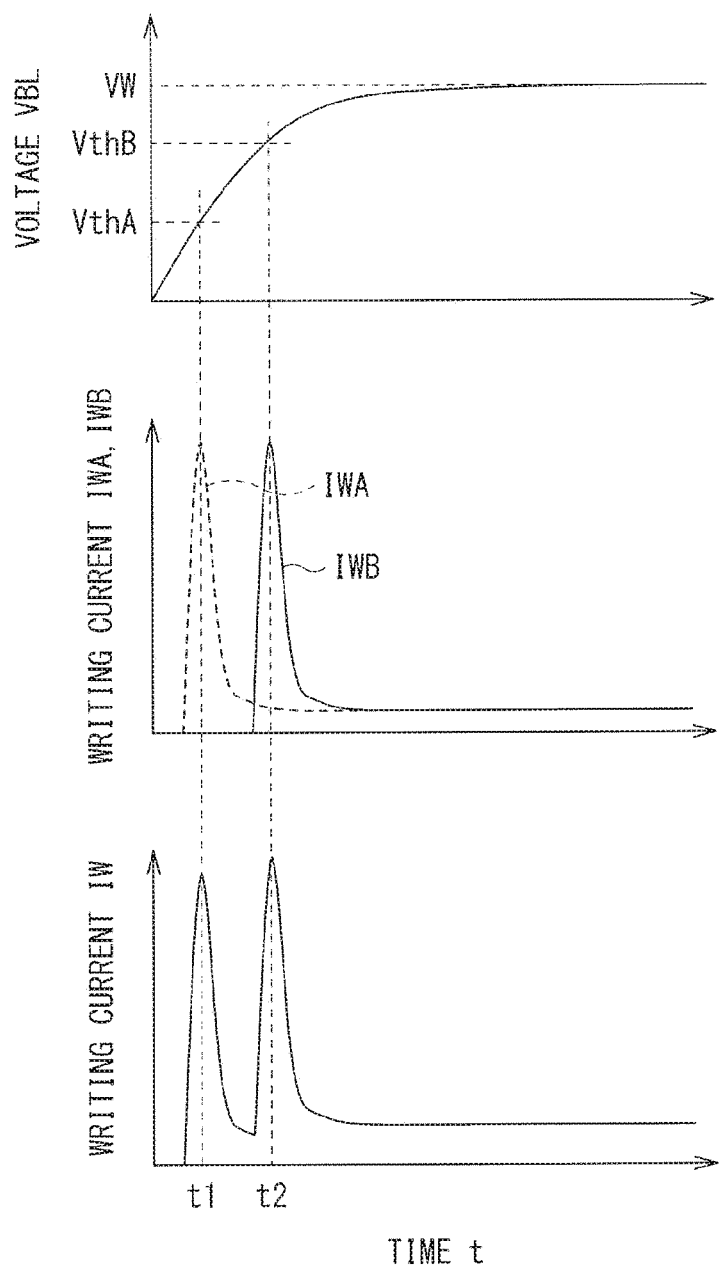

[ FIG. 5A ]
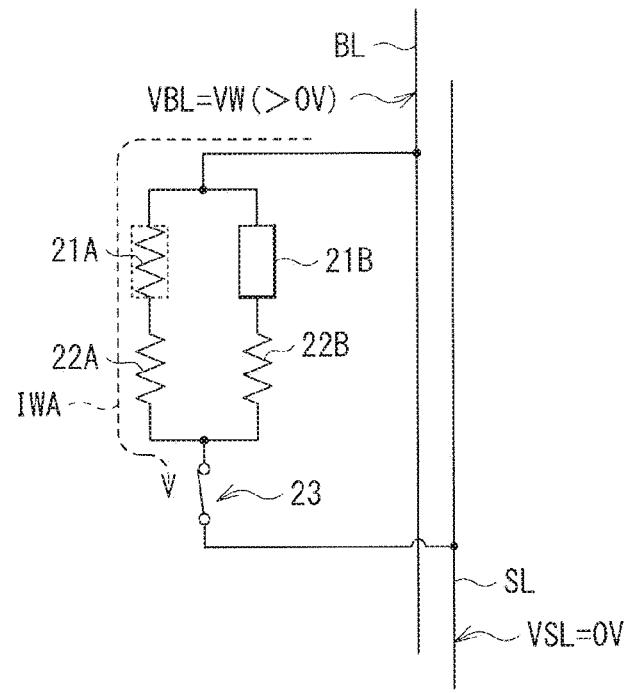
[ FIG. 5B ]
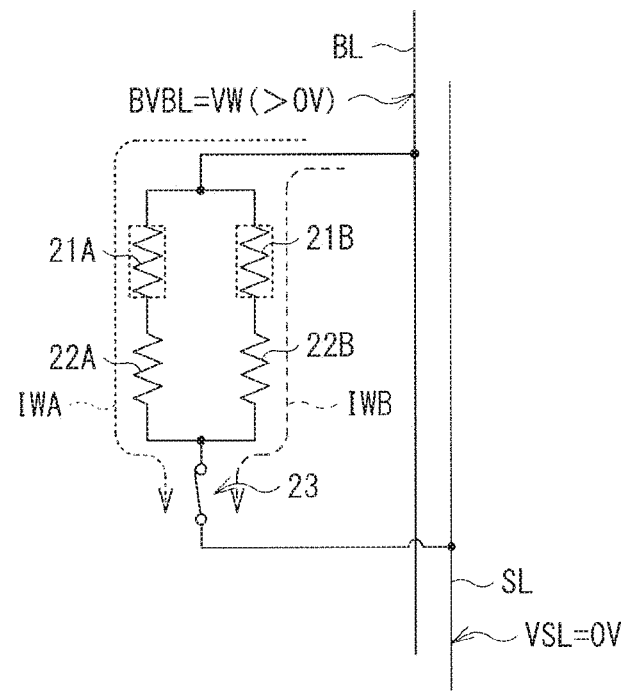

[ FIG. 6 ]
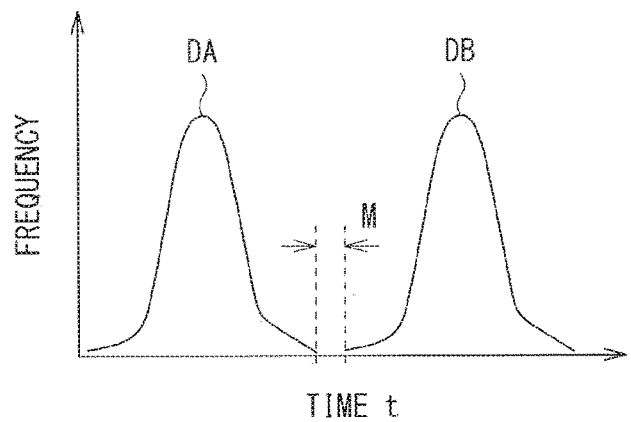
[ FIG. 7A ]
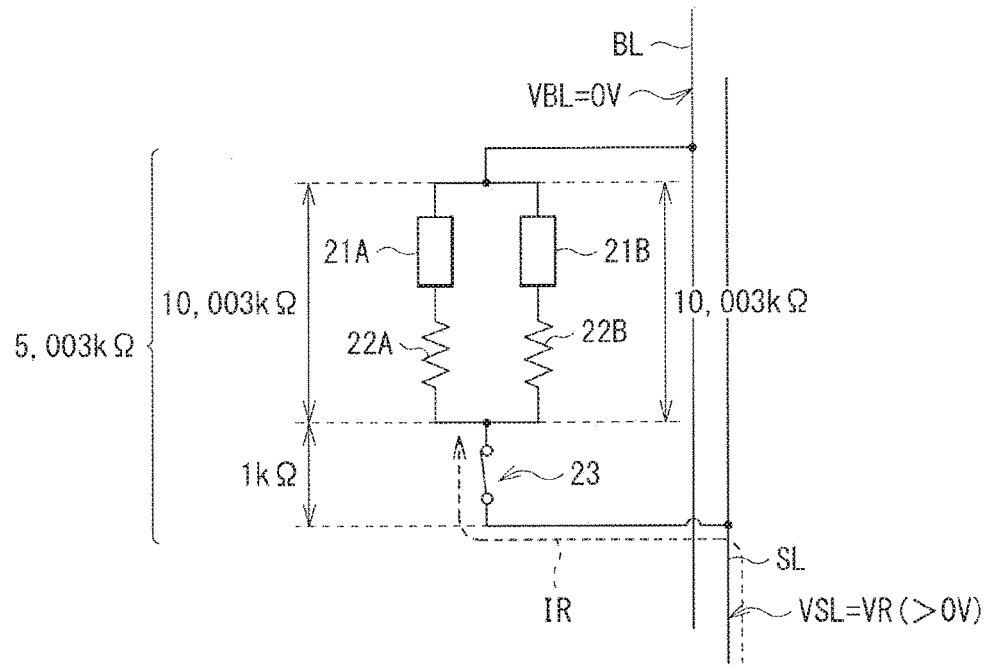

[ FIG. 7B ]
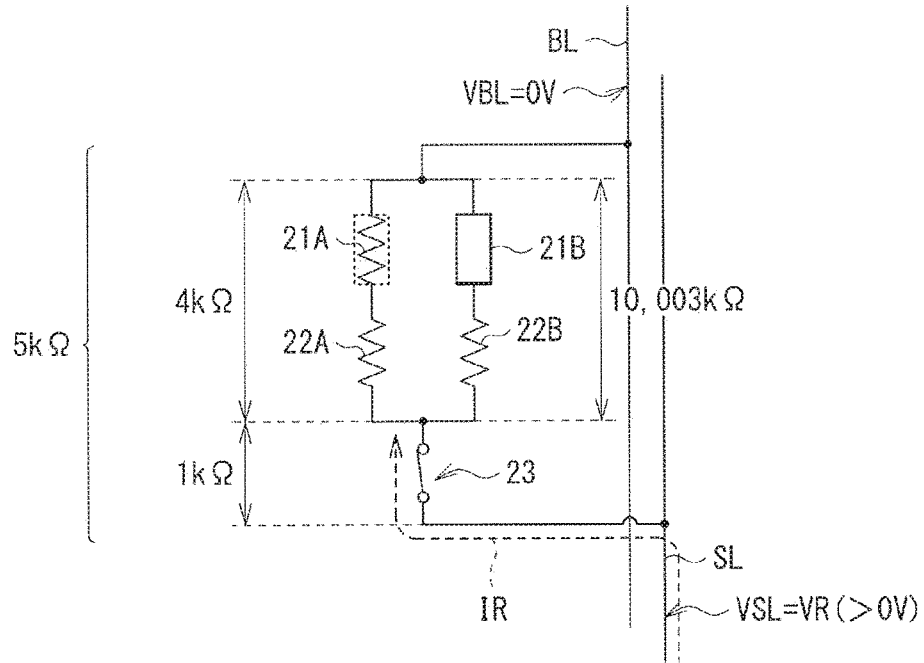
[ FIG. 7C ]
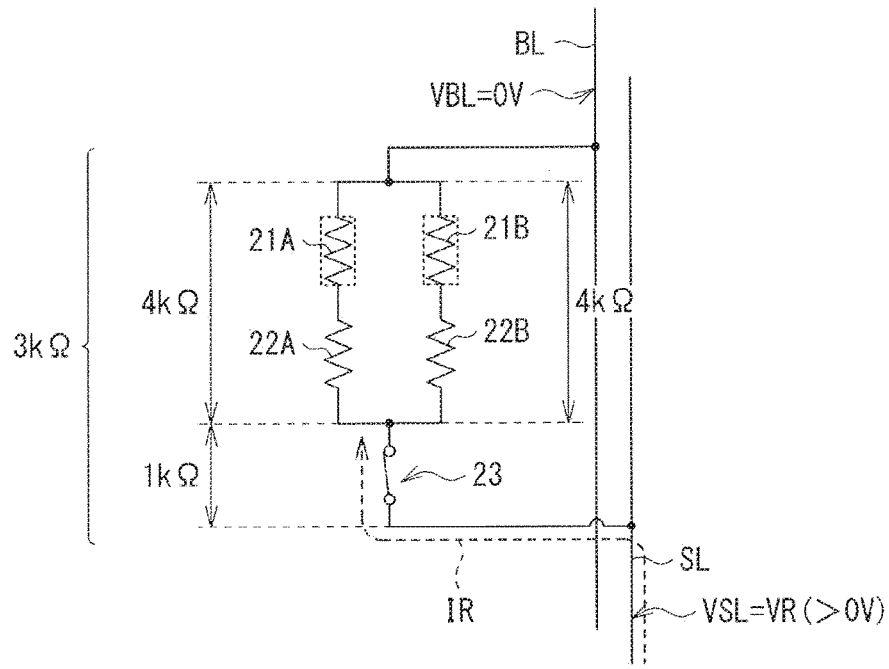

[ FIG. 8 ]
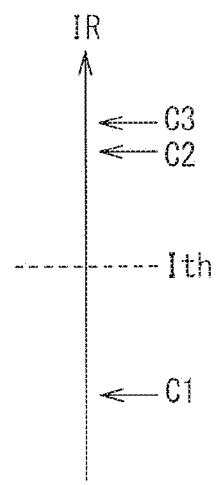
[ FIG. 9 ]
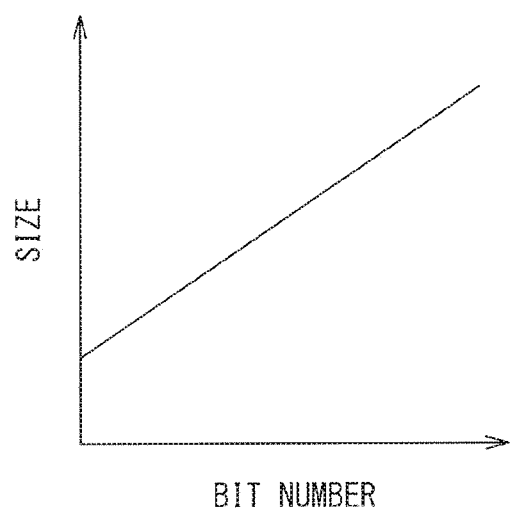

[ FIG. 10 ]
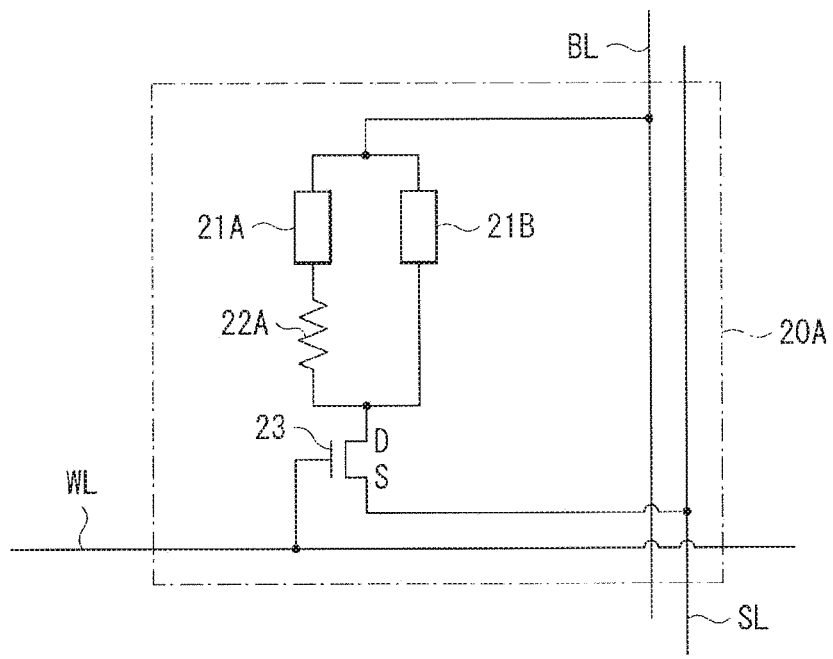
[ FIG. 11 ]
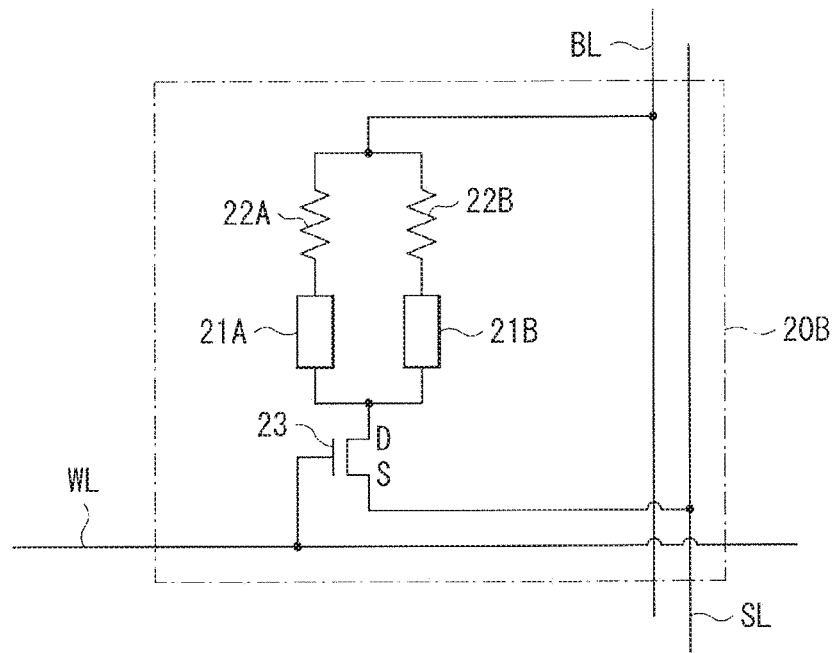

[ FIG. 12 ]
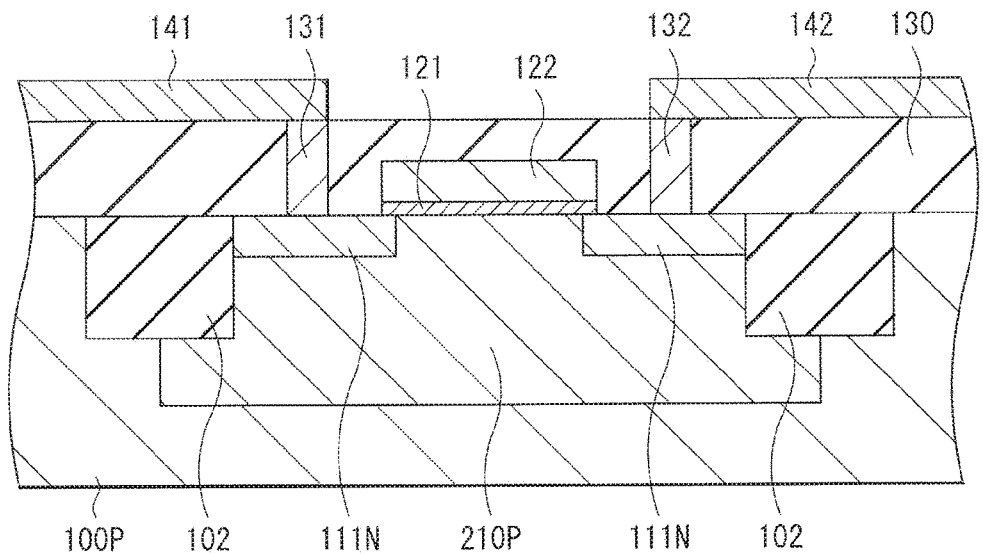
[ FIG. 13 ]
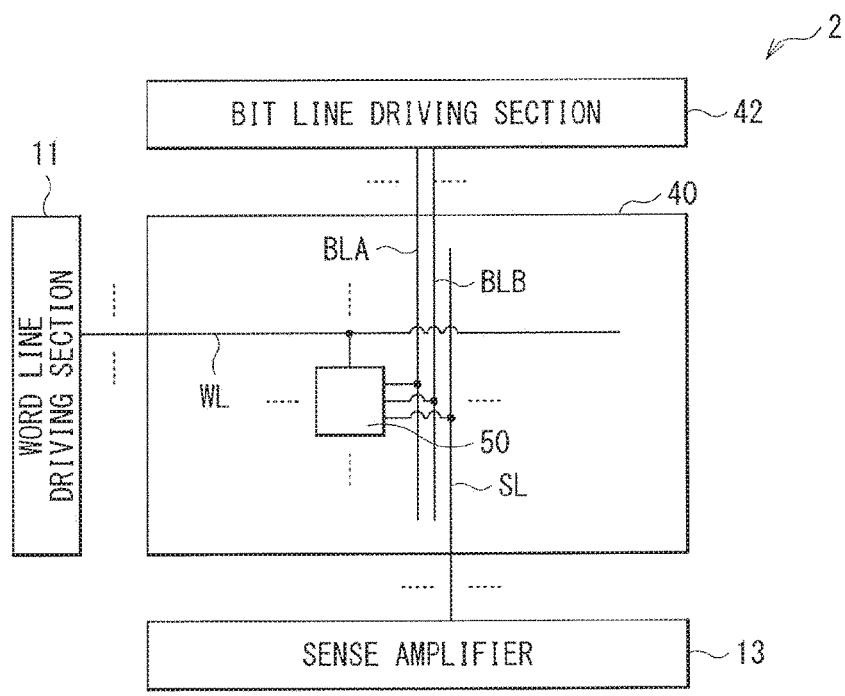

[ FIG. 14 ]
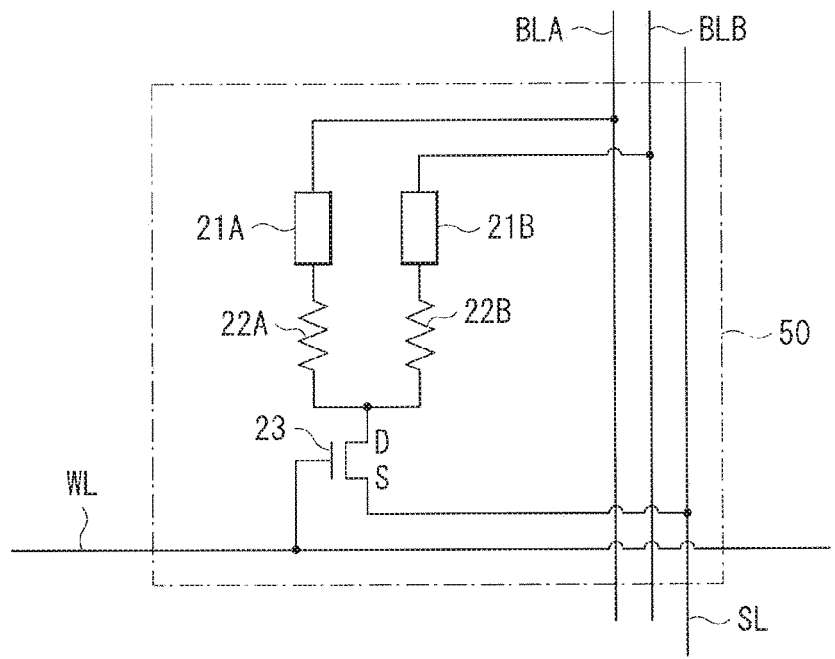
[ FIG. 15A ]
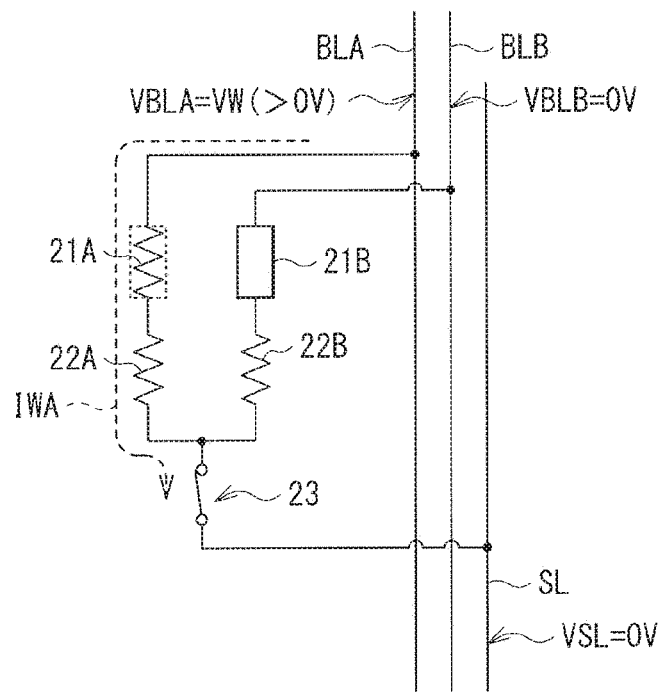

[ FIG. 15B ]
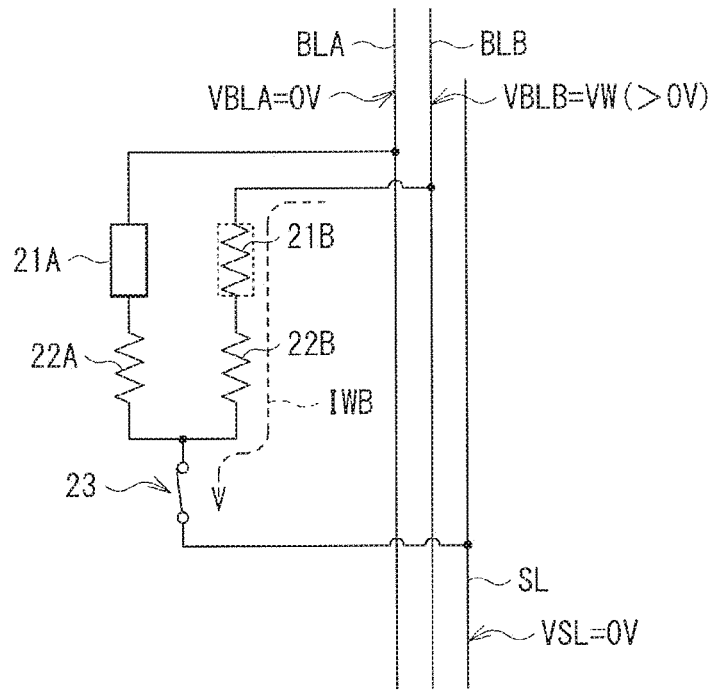
[ FIG. 15C ]
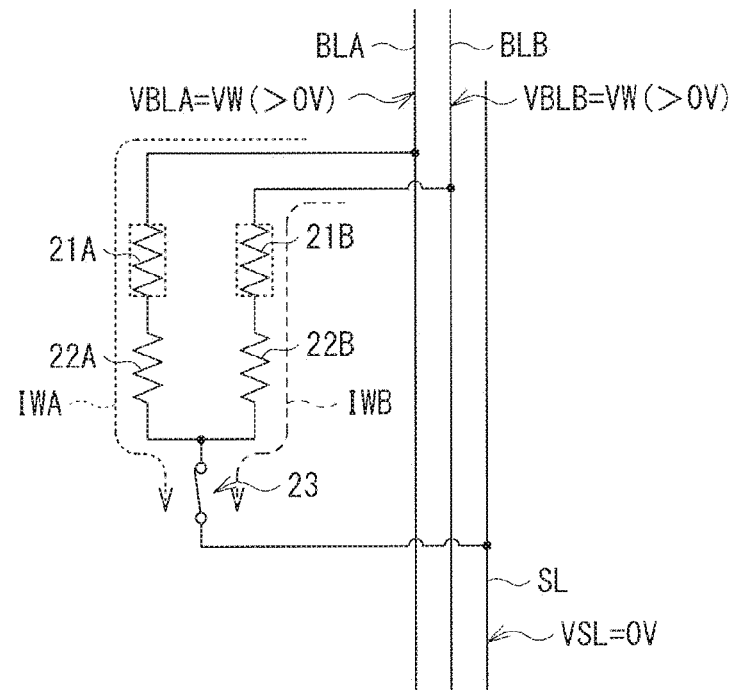

[ FIG. 16A ]
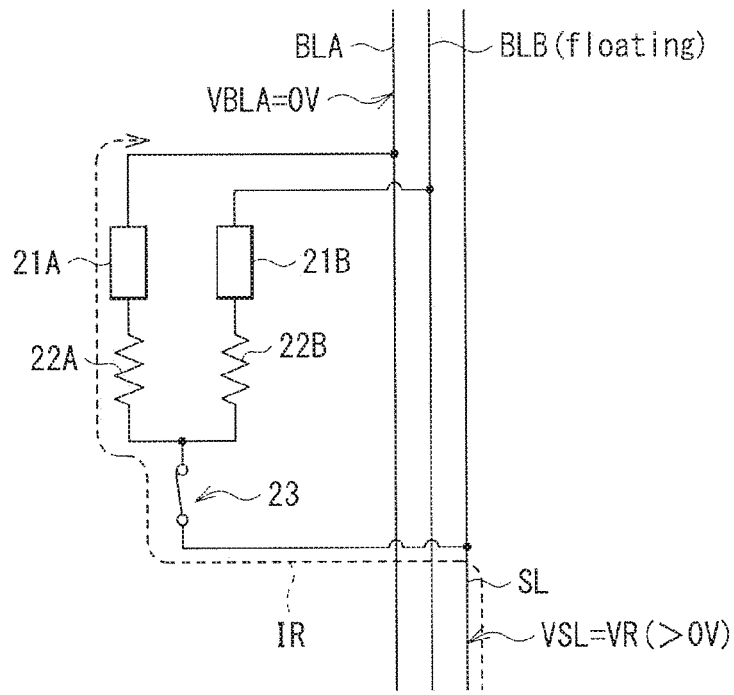
[ FIG. 16B ]
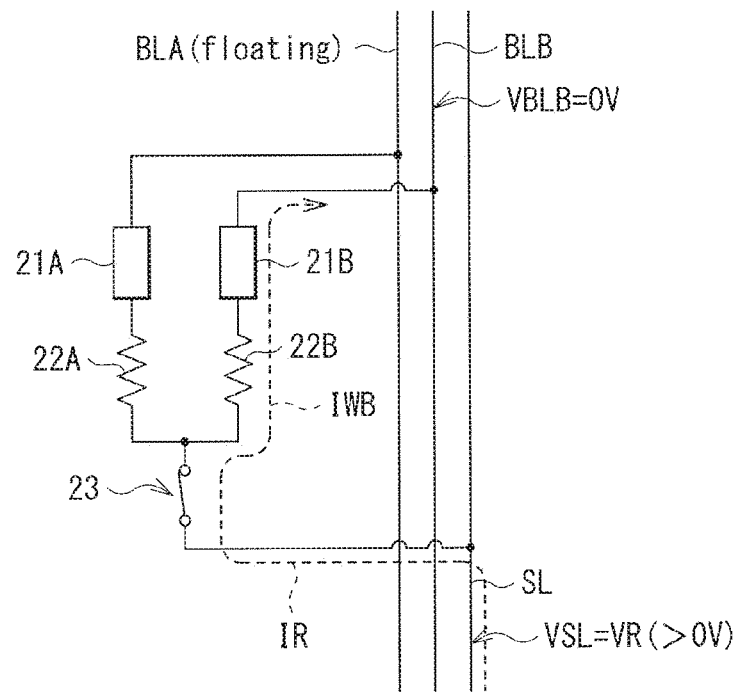

[ FIG. 17 ]
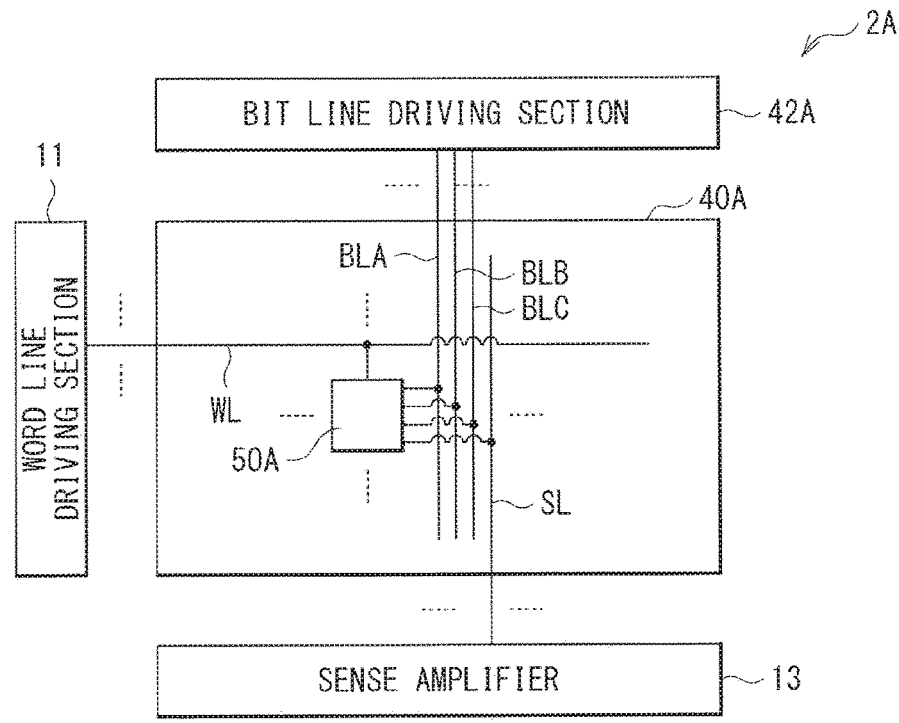
[ FIG. 18 ]
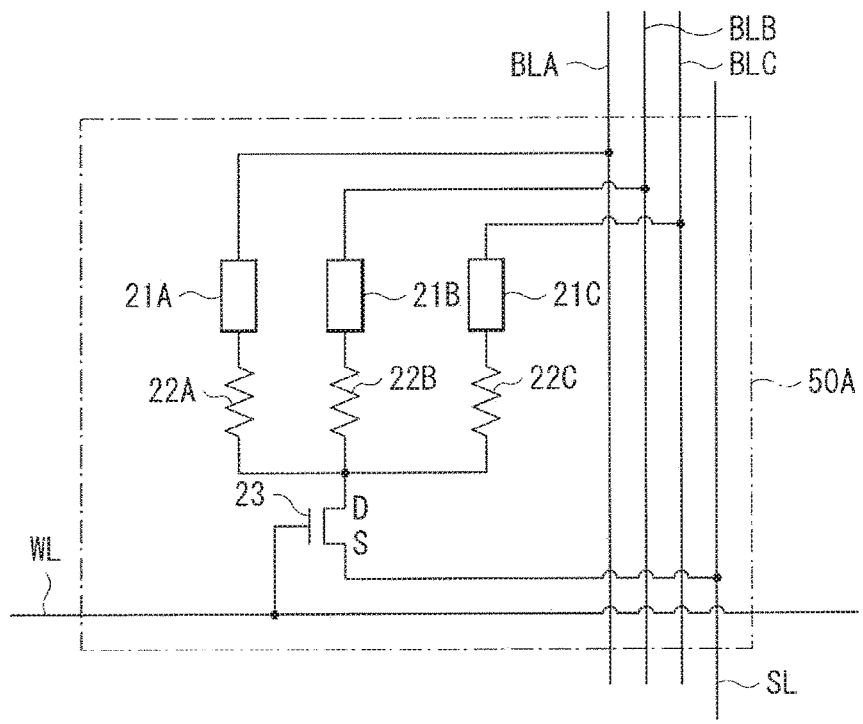

[ FIG. 19 ]
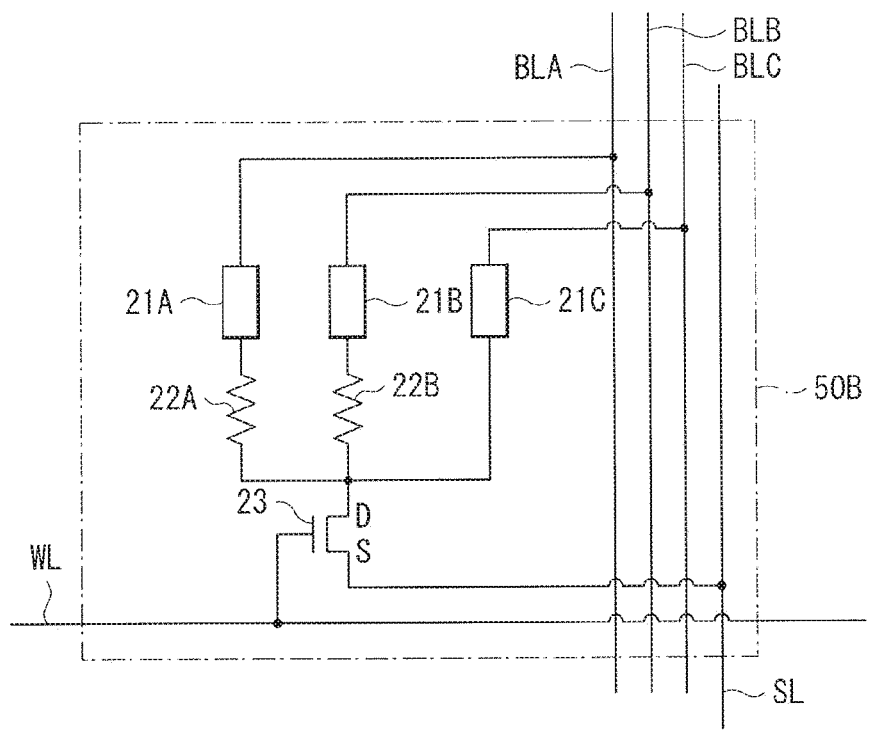

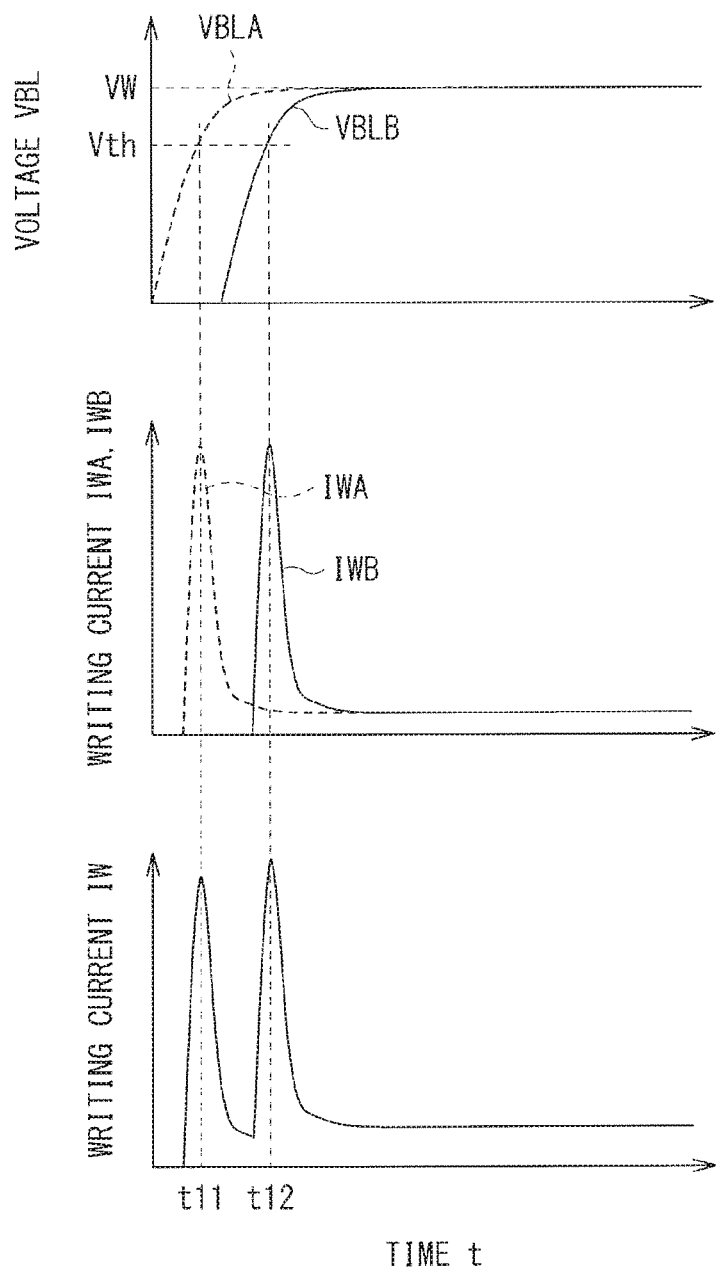
[ FIG. 20 ]

ANTI-FUSES MEMORY CELL AND MEMORY APPARATUS

CROSS REFERENCE TO RELATED APPLICATIONS

This application is a U.S. National Phase of International Patent Application No. PCT/JP2015/083446 filed on Nov. 27, 2015, which claims priority benefit of Japanese Patent Application No. JP 2015-008603 filed in the Japan Patent Office on Jan. 20, 2015. Each of the above-referenced applications is hereby incorporated herein by reference in its entirety.

TECHNICAL FIELD

The present disclosure relates to a memory cell including an anti-fuse, and to a memory apparatus including such a memory cell.

BACKGROUND ART

A non-volatile memory that holds information even if power is turned off is often integrated in an electronic apparatus. Examples of such a non-volatile memory include a one time programmable (OTP) memory to which data is written only once. One of memory elements configuring the OTP memory is an anti-fuse. A resistance state of the anti-fuse is changed from a high-resistance state (a non-conductive state) to a low-resistance state (a conductive state) in response to application of stress. For example, PTLs 1 and 2 each disclose a memory apparatus using the anti-fuse.

CITATION LIST

Patent Literature

PTL 1: Japanese Unexamined Patent Application Publication (Published Japanese Translation of PCT Application) No. 2006-510203
PTL 2: Japanese Unexamined Patent Application Publication No. 2012-174863

SUMMARY OF INVENTION

Incidentally, it is typically desirable for the memory apparatus to have a small area, and further size reduction of the memory apparatus is expected.

Therefore, it is desirable to provide a memory cell and a memory apparatus that each make it possible to reduce its size.

A memory cell according to an embodiment of the present disclosure includes anti-fuses, a resistor, and a selection transistor. The anti-fuses are respectively inserted into a plurality of paths, and one ends of the respective plurality of paths are coupled to one another. The resistor is inserted into one or more of the plurality of paths. The selection transistor is turned on to couple a first coupling terminal to the one ends of the respective plurality of paths.

A memory apparatus according to an embodiment of the present disclosure includes a memory cell and a control section that controls the memory cell. The memory cell includes anti-fuses, a resistor, and a selection transistor. The anti-fuses are respectively inserted into a plurality of paths, and one ends of the respective plurality of paths are coupled to one another. The resistor is inserted into one or more of the plurality of paths. The selection transistor is turned on to couple a first coupling terminal to the one ends of the respective plurality of paths.

In the memory cell and the memory apparatus according to the respective embodiments of the present disclosure, the anti-fuses are respectively inserted into the plurality of paths, and the resistor is inserted into one or more of the plurality of paths. In addition, the one ends of the respective plurality of paths are coupled to one another, and are coupled to the selection transistor.

According to the memory cell and the memory apparatus of the respective embodiments of the present disclosure, the anti-fuses are respectively inserted into the respective plurality of paths of which the one ends are coupled to one another, and the resistor is inserted into one or more of the plurality of paths, which makes it possible to reduce the size. Note that effects described here are non-limiting. Effects achieved by the technology may be one or more of effects described in the present disclosure.

BRIEF DESCRIPTION OF DRAWINGS

FIG. 1 is a block diagram illustrating a configuration example of a memory apparatus according to a first embodiment of the present disclosure.

FIG. 2 is a circuit diagram illustrating a configuration example of a memory cell illustrated in FIG. 1.

FIG. 3A is a cross-sectional diagram illustrating a cross-sectional configuration of a main part of a memory element illustrated in FIG. 2.

FIG. 3B is a cross-sectional diagram illustrating the cross-sectional configuration of the main part of the memory element illustrated in FIG. 2, after writing operation.

FIG. 4 is a timing waveform diagram illustrating the writing operation.

FIG. 5A is an explanatory diagram illustrating an example of the writing operation.

FIG. 5B is an explanatory diagram illustrating another example of the writing operation.

FIG. 6 is an explanatory diagram illustrating a characteristic example of the memory cell illustrated in FIG. 2.

FIG. 7A is an explanatory diagram illustrating an example of reading operation.

FIG. 7B is an explanatory diagram illustrating another example of the reading operation.

FIG. 7C is an explanatory diagram illustrating still another example of the reading operation.

FIG. 8 is another explanatory diagram illustrating the example of the reading operation.

FIG. 9 is an explanatory diagram illustrating relationship between a size of the memory apparatus and a bit number.

FIG. 10 is a circuit diagram illustrating a configuration example of a memory cell according to a modification.

FIG. 11 is a circuit diagram illustrating a configuration example of a memory cell according to another modification.

FIG. 12 is a cross-sectional diagram illustrating a cross-sectional configuration of a main part of a memory element according to another modification.

FIG. 13 is a block diagram illustrating a configuration example of a memory apparatus according to a second embodiment of the present disclosure.

FIG. 14 is a circuit diagram illustrating a configuration example of a memory cell illustrated in FIG. 13.

FIG. 15A is an explanatory diagram illustrating an example of writing operation.

FIG. 15B is an explanatory diagram illustrating another example of the writing operation.

FIG. 15C is an explanatory diagram illustrating still another example of the writing operation.

FIG. 16A is an explanatory diagram illustrating an example of reading operation.

FIG. 16B is an explanatory diagram illustrating another example of the reading operation.

FIG. 17 is a block diagram illustrating a configuration example of a memory apparatus according to a modification.

FIG. 18 is a circuit diagram illustrating a configuration example of a memory cell illustrated in FIG. 17.

FIG. 19 is a circuit diagram illustrating a configuration example of a memory cell according to another modification.

FIG. 20 is an explanatory diagram illustrating an example of writing operation in a memory apparatus according to a modification.

DESCRIPTION OF EMBODIMENTS

Some embodiments of the present disclosure are described in detail below with reference to drawings. Note that description is given in the following order.
1. First embodiment (a memory apparatus having redundancy)
2. Second embodiment (a memory apparatus in which a plurality of pieces of bit data are stored in each memory cell)

1. First Embodiment

Configuration Example

FIG. 1 is a diagram illustrating a configuration example of a memory apparatus (a memory apparatus 1) according to a first embodiment. The memory apparatus 1 is a memory apparatus that has redundancy and uses an anti-fuse serving as a memory element. The memory apparatus 1 includes a memory cell array 10, a word line driving section 11, a bit line driving section 12, and a sense amplifier 13.

The memory cell array 10 includes a plurality of memory cells 20 that are arranged in a matrix. In addition, the memory cell array 10 includes a plurality of word lines WL that extend in a row direction (a horizontal direction), and a plurality of bit lines BL and a plurality of source lines SL that extend in a column direction (a vertical direction). One end of each of the word lines WL is coupled to the word line driving section 11, one end of each of the bit lines BL is coupled to the bit line driving section 12, and one end of each of the source lines SL is coupled to the sense amplifier 13. Each of the memory cells 20 is coupled to the word line WL, the bit line BL, and the source line SL.

FIG. 2 is a diagram illustrating a configuration example of the memory cell 20. The memory cell 20 includes memory elements 21A and 21B, resistors 22A and 22B, and a selection transistor 23.

Each of the memory elements 21A and 21B functions as an anti-fuse. Each of the memory elements 21A and 21B includes two terminals. One end of the memory element 21A is coupled to one end of the memory element 21B and the bit line BL, and the other end of the memory element 21A is coupled to one end of the resistor 22A. The one end of the memory element 21B is coupled to the one end of the memory element 21A and the bit line BL, and the other end of the memory element 21B is coupled to one end of the resistor 22B. A resistance state of each of the memory elements 21A and 21B is changed from a high-resistance state (a non-conductive state) to a low-resistance state (a conductive state) in response to application of a stress voltage between both terminals of each of the memory elements 21A and 21B. As mentioned above, each of the memory elements 21A and 21B holds information (bit data) depending on the resistance state.

In addition, the stress voltages (thresholds Vth) necessary to change the resistance states of the respective memory elements 21A and 21B are different from each other. More specifically, a threshold VthA of the memory element 21A is set lower than a threshold VthB of the memory element 21B. This makes it possible to reduce a size of each of the selection transistor 23, a driver of the bit line driving section 12, and the sense amplifier 13 in the memory apparatus 1, as described later.

FIGS. 3A and 3B are diagrams each illustrating an example of a cross-sectional configuration of a main part of the memory element 21A, where FIG. 3A illustrates a configuration in the high-resistance state, and FIG. 3B illustrates a configuration in the low-resistance state. The memory element 21A is provided in a region surrounded by a device separation insulation layer 102 on an insulation layer 101 that is uniformly provided on a P-type semiconductor substrate 100P. In other words, the memory apparatus 1 has a silicon on insulator (SOI) configuration. Note that the memory apparatus 1 is formed through a common complementary metal oxide semiconductor (CMOS) manufacturing process.

The memory element 21A includes semiconductor layers 110P, 111N, and 112N, a dielectric film 121, an electroconductive film 122, and electrodes 131 and 132. The memory element 21A has a so-called MOS configuration.

The semiconductor layer 110P is a P-type semiconductor layer provided in a region surrounded by the insulation layer 102, and configures a so-called P-well. The semiconductor layer 110P functions as a so-called back gate of the memory element 21A. The semiconductor layer 110P is made of a semiconductor material in which silicon (Si) is doped with an impurity such as boron (B). Note that a voltage of 0 V is applied to the semiconductor layer 110P through an unillustrated contact.

The semiconductor layers 111N and 112N are N-type semiconductor layers provided in the semiconductor layer 110P. The semiconductor layer 111N and the semiconductor layer 112N are separately disposed with a predetermined interval in between. The semiconductor layers 111N and 112N are each made of a semiconductor material, for example, silicon doped with an impurity such as arsenic (As) and phosphorus (P). The semiconductor layers 111N and 112N each have a thickness of about 50 nm to about 200 nm. Such semiconductor layers 111N and 112N are easily formed by, for example, a self-alignment method or a method using a mask pattern such as a photoresist and an oxide film. A distance L between the semiconductor layer 111N and the semiconductor layer 112N is desirably reduced as much as possible. More specifically, for example, it is possible for the distance L to be a minimum working size in the manufacturing process. Alternatively, the distance L is preferably further reduced from the minimum working size within a range in which the semiconductor layer 111N and the semiconductor layer 112N are normally separated from each other. This makes it possible to reduce a device size of the memory element 21A and to facilitate formation of a filament F described later.

The dielectric film 121 is provided on the semiconductor layer 110P in a region between the semiconductor layer 111N and the semiconductor layer 112N, and on a portion of each of the semiconductor layers 111N and 112N. The dielectric film 121 is made of, for example, silicon oxide ($SiO_2$), and have a thickness of about several nm to about 20 nm.

The electroconductive film 122 is provided on the dielectric film 121. The electroconductive film 122 is made of, for example, an electroconductive material such as polycrystalline silicon and a silicide metal, and has a thickness of about 50 nm to about 500 nm. In this example, the electroconductive film 122 is in an electrically floating state.

The insulation layer 130 is so provided as to cover the semiconductor layers 111N to 113N, the electroconductive film 12, the insulation layer 102, and other layers. The insulation layer 130 is made of, for example, an insulation material such as silicon oxide, and has a thickness of about 50 nm to about 1000 nm.

The electrode 131 is so provided on the semiconductor layer 111N as to be electrically coupled to the semiconductor layer 111N. The electrode 131 is so provided as to penetrate through the insulation layer 130, and is coupled to an electroconductive film 141 provided on the insulation layer 130. The electroconductive film 141 is led to the bit line BL. Likewise, the electrode 132 is so provided on the semiconductor layer 112N as to be electrically coupled to the semiconductor layer 112N. The electrode 132 is so provided as to penetrate through the insulation layer 130 and is coupled to an electroconductive film 142 provided on the insulation layer 130. The electroconductive film 142 is led to the one end of the resistor 22A. The electrodes 131 and 132 are each made of, for example, tungsten (W), and the electroconductive films 141 and 142 are each made of, for example, aluminum (Al).

In the memory element 21A illustrated in FIG. 3A, a resistance value between the electrodes 131 and 132 is high. When a stress voltage is applied between the electrodes 131 and 132 of such a memory element 21A in the writing operation, the filament F is formed on surfaces of the respective semiconductor layers 111N, 110P, and 112N as illustrated in FIG. 3B. More specifically, a current first flows between the electrodes 131 and 132 by the stress voltage between the electrodes 131 and 132, which causes heat generation. Thereafter, portions of the respective electrodes 131 and 132 are melted due to the heat generation to form the filament F. Therefore, the filament F contains the electroconductive material. The resistance value between the electrodes 132 and 132 after the writing operation is accordingly reduced. As mentioned above, the resistance state of the memory element 21A is changed from the high-resistance state to the low-resistance state by the formation of the filament F in the writing operation.

Hereinbefore, the memory element 21A is described as an example. The memory element 21B is substantially similar to the memory element 21A. To make the threshold VthA of the memory element 21A smaller than the threshold VthB of the memory element 21B, however, the memory element 21A is configured to keep heat, for example, as compared with the memory element 21B. This facilitates the formation of the filament F in the memory element 21A in the writing operation as compared with the memory element 21B, which allows for reduction of the threshold VthA. More specifically, for example, it is possible to make an area of the electroconductive films 141 and 142 coupled to the memory element 21A smaller than an area of the electroconductive films 141 and 142 coupled to the memory element 21B. In addition, it is possible to make a volume (an active volume) of the semiconductor layer 110P in the memory element 21A smaller than a volume of the semiconductor layer 110P in the memory element 21B.

Moreover, the distance L between the semiconductor layer 111N and the semiconductor layer 112N of the memory element 21A may be made smaller than the distance L between the semiconductor layer 111N and the semiconductor layer 112N of the memory element 21B. This enhances an electric field in the memory element 21A as compared with the memory element 21B, which further facilitates the formation of the filament F and makes it possible to lower the threshold VthA.

Furthermore, the threshold VthA of the memory element 21A may be made lower than the threshold VthB of the memory element 21B by, for example, forming the memory elements 21A and 21B under different process conditions. Note that, for example, addition and alternation of a manufacturing process are necessary in this case.

The one end of the resistor 22A (FIG. 2) is coupled to the other end of the memory element 21A, and the other end of the resistor 22A is coupled to the other end of the resistor 22B and a drain of the selection transistor 23. The one end of the resistor 22B is coupled to the other end of the memory element 21B, and the other end of the resistor 22B is coupled to the other end of the resistor 22A and the drain of the selection transistor 23. The resistors 22A and 21B are each made of, for example, polysilicon. Note that the resistor is not limited thereto, and for example, a so-called diffusion resistor or a ballast resistor may be used alternatively. In this example, the resistance value of the resistor 22A is set equivalent to the resistance value of the resistor 22B. A resistance value R of each of the resistors 22A and 22B is so set as to satisfy the following expression, with use of a resistance value Rtrm of each of the memory elements 21A and 21B in the low-resistance state and a resistance value Ron of the selection transistor 23 in an on state.

$$Rtrm + R >> Ron \quad (1)$$

This facilitates the formation of the filament F in the memory element 21B as described later.

The selection transistor 23 is an N-type MOS transistor in this example. The drain of the selection transistor 23 is coupled to the other end of the resistor 22A and the other end of the resistor 22B, a gate thereof is coupled to the word line WL, and a source thereof is coupled to the source line SL. A gate width W of the selection transistor 23 is, for example, 40 [μm].

The word line driving section 11 (FIG. 1) drives the word line WL, thereby controlling the writing operation and the reading operation in the memory cell array 10. More specifically, the word line driving section 11 sets a voltage of the word line WL to a high level, thereby selecting one row (one word) including the memory cell 20 that is an object of the writing operation and the reading operation, in this example.

The bit line driving section 12 drives the bit line BL, thereby controlling the writing operation in the memory cell array 10. More specifically, the bit line driving section 12 sets a voltage VBL of the bit line BL to a positive voltage VW (VW>0), thereby selecting the memory cell 20 that is the object of the writing operation, in the selected row, and applying the stress voltage to the memory elements 21A and 21B of the selected memory cell 20. The voltage VW may be set to, for example, 6 [V]. In addition, in a case of performing the reading operation, the bit line driving section 12 sets the voltage VBL of all of the bit lines BL to 0 V.

The sense amplifier 13 drives the source line SL, thereby controlling the reading operation in the memory cell array 10. More specifically, the sense amplifier 13 sets a voltage VSL of the source line SL to a positive voltage VR (VR>0) and detects a reading current IR that flows through the source line SL, thereby reading information held by the memory cell 20 that is the object of the reading operation. The voltage VR may be set to, for example, 1.8 [V]. In addition, in a case of performing the writing operation, the sense amplifier 13 sets the voltage VSL of all of the source lines SL to 0 V.

This configuration causes the voltage VW (the stress voltage) to be applied to the one ends of the respective memory elements 21A and 21B and causes the voltage of 0 V to be applied to the other ends of the respective resistors 22A and 22B through the selection transistor 23, in the memory cell 20 that is the object of the writing operation. This changes the resistance states of the two memory elements 21A and 21B from the high-resistance state to the low-resistance state. As mentioned above, the memory cell 20 has redundancy. In other words, for example, even in a case where the resistance state of one of the two memory elements 21A and 21B is not changed to the low-resistance state in the writing operation for some reasons, changing the resistance state of the other memory element to the low-resistance state makes it possible to change a resistance state of the entire memory cell 20 to the low-resistance state. In addition, even in a case where one of the two memory elements 21A and 21B is put into an open state for some reasons after the resistance state of each of the two memory elements 21A and 21B is changed to the low-resistance state, it is possible to change the resistance state of the entire memory cell 20 to the low-resistance state. Since the memory apparatus 1 has redundancy as mentioned above, it is possible to reduce possibility of data loss even if an unexpected situation occurs.

In the memory cell 20 that is the object of the reading operation, the voltage of 0 V is applied to the one ends of the respective memory elements 21A and 21B and the voltage VR is applied to the other ends of the resistors 22A and 22B through the selection transistor 23. This generates the reading current IR corresponding to the resistance states of the memory elements 21A and 21B in the memory cell 20. In other words, in a case where the resistance state of each of the memory elements 21A and 21B is the high-resistance state, the resistance state of the entire memory cell 20 is the high-resistance state. Therefore, the reading current IR becomes smaller. In contrast, in a case where the resistance state of the memory element 21A or the memory element 21B or both is the low-resistance state, the resistance state of the entire memory cell 20 is the low-resistance state. Therefore, the reading current IR becomes larger. The sense amplifier 13 detects the reading current IR, thereby reading information held by the memory cell 20.

Here, the memory elements 21A and 21B correspond to a specific example of "anti-fuses" in the present disclosure.

Operation and Action

Subsequently, operation and action of the memory apparatus 1 according to the present embodiment are described.

Entire Operation Outline

First, an entire operation outline of the memory apparatus 1 is described with reference to FIG. 1. In the writing operation, the word line driving section 11 drives the word line WL, thereby controlling the writing operation in the memory cell array 10. The bit line driving section 12 drives the bit line BL, thereby controlling the writing operation in the memory cell array 10. In the memory cell 20 that is the object of the writing operation, the voltage VW (the stress voltage) is applied to the one ends of the respective memory elements 21A and 21B, and the voltage of 0 V is applied to the other ends of the respective resistors 22A and 22B through the selection transistor 23. This changes the resistance state of each of the two memory elements 21A and 21B from the high-resistance state to the low-resistance state, and information is written into the memory cell 20.

In the reading operation, the word line driving section 11 drives the word line WL, thereby controlling the reading operation in the memory cell array 10. The sense amplifier 13 drives the source line SL, thereby controlling the reading operation in the memory cell array 10. In the memory cell 20 that is the object of the reading operation, the voltage of 0 V is applied to the one ends of the respective memory elements 21A and 21B, and the voltage VR is applied to the other ends of the respective resistors 22A and 22B through the selection transistor 23. This generates the reading current IR corresponding to the resistance state of each of the memory elements 21A and 21B, in the memory cell 20. The sense amplifier 13 detects the reading current IR, thereby reading the information held by the memory cell 20.

Writing Operation

Next, the writing operation on the memory cell 20 is described in detail.

FIG. 4 is a timing waveform diagram of the memory cell 20 in the writing operation. FIGS. 5A and 5B are diagrams each illustrating the writing operation on the memory cell 20, where FIG. 5A illustrates a state at certain timing, and FIG. 5B illustrates a state at timing after the timing of FIG. 5A. In FIGS. 5A and 5B, the selection transistor 23 is illustrated as a switch indicating an on or off state.

In the writing operation, the sense amplifier 13 sets the voltage VSL of the source line SL to 0 V, and the bit line driving section 12 sets the voltage VBL of the bit line BL to the voltage VW as illustrated in FIG. 4. At this time, the voltage VBL varies with a time constant corresponding to a resistance component of the bit line BL itself or a load.

Thereafter, when the voltage VBL of the bit line BL reaches the threshold VthA of the memory element 21A at timing t1, a large writing current IWA flows through the memory element 21A, the resistor 22A, and the selection transistor 23 in order, as illustrated in FIG. 5A. In other words, the filament F is formed in the memory element 21A and the resistance state of the memory element 21A is changed from the high-resistance state to the low-resistance state (the resistance value Rtrm) at this time. Thereafter, as illustrated in FIG. 4, a current value of the writing current IWA is decreased to a value corresponding to the resistance value Rtrm in the low-resistance state.

Thereafter, when the voltage VBL of the bit line BL reaches the threshold VthB of the memory element 21B at timing t2, a large writing current IWB flows through the memory element 21B, the resistor 22B, and the selection transistor 23 in order, as illustrated in FIG. 5B. In other words, the filament F is formed in the memory element 21B and the resistance state of the memory element 21B is changed from the high-resistance state to the low-resistance state (the resistance value Rtrm) at this time. Thereafter, as illustrated in FIG. 4, a current value of the writing current IWB is decreased to a value corresponding to the resistance value Rtrm in the low-resistance state.

As mentioned above, the writing current IWA and the writing current IWB flow through the memory circuit 20. In other words, a writing current IW (=IWA+IWB) that is a total current of the writing current IWA and the writing current IWB flows through the selection transistor 23 (FIG. 4). The driver of the bit line driving section 12 supplies the writing current IW to the memory circuit 20, and the sense amplifier 13 sinks the writing current IW.

As mentioned above, in the memory apparatus 1, the threshold VthA of the memory element 21A and the threshold VthB of the memory element 21B are made different from each other. This makes it possible to shift the timing t1 at which the large writing current IWA flows through the memory element 21A from the timing t2 at which the large writing current IWB flows through the memory element 21B, in the memory apparatus 1. As a result, it is possible to suppress a peak value of the writing current IW (=IWA+IWB) in the memory apparatus 1 as illustrated in FIG. 4.

In other words, for example, if the threshold VthA of the memory element 21A is made equal to the threshold VthB of the memory element 21B, the filament F is formed in each of the memory elements 21A and 21B at the same timing. This causes the large writing currents IWA and IWB to flow at the same timing. In other words, the peak value of the writing current IW (=IWA+IWB) becomes large. Therefore, it is necessary to increase the gate width W of the selection transistor 23 in order to allow such a large current to flow, which may disadvantageously increase the size of the memory cell. Further, it is necessary for the driver of the bit line driving section 12 and the sense amplifier 13 to deal such a large writing current, which may disadvantageously increase the size of the bit line driving section 12 and the size of the sense amplifier 13.

In contrast, in the memory apparatus 1, since the threshold VthA of the memory element 21A is made different from the threshold VthB of the memory element 21B, it is possible to shift the respective timings at which the large writing currents IWA and IWB flow, from each other, which makes it possible to suppress the peak value of the writing current IW. As a result, in the memory apparatus 1, it is possible to reduce the gate width W of the selection transistor 23, which allows for size reduction of the memory cell 20. Further, it is possible to reduce the size of the bit line driving section 12 and the size of the sense amplifier 13.

As mentioned above, to shift the respective timings at which the large writing currents IWA and IWB flow, from each other, it is necessary to consider, for example, process variation in the manufacturing process in the design phase.

FIG. 6 is a diagram illustrating distribution DA of the timing t1 at which the writing current IWA reaches a peak and distribution DB of the timing t2 at which the writing current IWB reaches a peak. In consideration of the process variation in the manufacturing process, the timing t1 is distributed as the distribution DA, and the timing t2 is similarly distributed as the distribution DB. In such a case, it is desirable to prevent the distribution DA from overlapping with the distribution DB on a time axis. Further, it is preferable to provide a margin M in order to prevent the distribution DA from overlapping with the distribution DB on the time axis. This makes it possible to shift the respective timings at which the large writing currents IWA and IWB flow, from each other, for example, even if the process is varied.

In addition, in the memory apparatus 1, the resistor 22A is coupled to the memory element 21A having the lower threshold. This makes it possible to maintain a large voltage difference between the both ends of the memory element 21B having the larger threshold even in a case where the filament F is formed in the memory element 21A and the resistance state of the memory element 21A is changed to the low-resistance state (the resistance value Rtrm), for example, as illustrated in FIG. 5A. This allows for formation of the filament F in the memory element 21B. In other words, for example, in a case where the resistor 22A is not provided, the voltage difference between the both ends of the memory element 21B is decreased upon changing the resistance state of the memory element 21A to the low-resistance state (the resistance value Rtrm). In this case, the filament F may not be formed in the memory element 21B and signification of the redundancy is lost. In contrast, since the resistor 22A is provided in the memory apparatus 1, it is possible to facilitate the formation of the filament F in the memory element 21B.

More specifically, for example, in a case where the voltage VBL of the bit line BL is set to 6 [V], the resistance value Ron of the selection transistor 23 in the on state is set to 150[Ω], the resistance value Rtrm of the memory element 21A in the low-resistance state is set to 1 k [Ω], and the resistance value R of the resistor 22A is set to 3 k [Ω], the voltage difference between the one end of the memory element 21A and the other end of the resistor 22A becomes 5.8 [V]. Setting the resistance value R of the resistor 22A to the resistance value R satisfying the expression 1 in such a manner makes it possible to maintain the large voltage difference between the both ends of the memory element 21B. For example, in a case where polysilicon having sheet resistance of 2 k [Ω/sq.] is used to configure the resistor 22A having the resistance value R of 3 k [Ω], the size of the resistor 22A becomes, for example, 3 [μm] in width and [2 μm] in length. In other words, even in a case where such a resistor 22A is provided, the resistor 22A hardly influences the size of the memory cell 20 because the size of the resistor 22A is sufficiently smaller than the device size of the selection transistor 23. In other words, providing the resistor 22A makes it possible to facilitate the formation of the filament F in the memory element 21B while suppressing influence to the size of the memory cell 20. Note that, if the resistance value R of the resistor 22A is made excessively large, the filament F is difficult to be formed in the memory element 21A. Therefore, the resistance value R of the resistor 22A is desirably set to a value that allows for formation of the filament F in the memory element 21A while satisfying the expression 1.

In addition, since the resistor 22B that has the resistance value R same as that of the resistor 22A is provided in the memory apparatus 1, it is possible to facilitate design. In other words, the timing t1 at which the writing current IWA reaches the peak is influenced by the resistance value of the resistor 22A in addition to the threshold VthA of the memory element 21A. Likewise, the timing t2 at which the writing current IWB reaches the peak is influenced by the resistance value of the resistor 22B in addition to the threshold VthB of the memory element 21B. In the memory apparatus 1, since the resistance values of the respective resistors 22A and 22B are set equal to each other, it is possible to suppress influence of the resistors 22A and 22B to the timing difference between the timing t1 and the timing t2, which makes it possible to facilitate design.

Reading Operation

In the memory cell 20 in which the writing operation has not been performed, each of the memory elements 21A and 21B is in the high-resistance state (case C1). In contrast, in the memory cell 20 in which the writing operation has been performed, each of the memory elements 21A and 21B is in the low-resistance state (case C3). Moreover, in a case where the writing operation has been performed but the writing operation has not been sufficient, one of the memory elements 21A and 21B may be in the high-resistance state and the other memory element may be in the low-resistance state (case C2) in some cases. Further, a case where after the writing operation has been normally performed and the resistance state of each of the memory elements 21A and 21B is changed to the low-resistance state, one of the memory elements 21A and 21B is put into the open state for some reasons, also corresponds to the case C2. The reading operation in the respective cases C1 to C3 are described below.

FIGS. 7A to 7C are diagrams each illustrating the reading operation on the memory cell 20, where FIG. 7A illustrates the reading operation in the case C1, FIG. 7B illustrates the reading operation in the case C2, and FIG. 7C illustrates the reading operation in the case C3. The case C2 illustrated in FIG. 7B is a case where the memory element 21A is in the low-resistance state and the memory element 21B is in the high-resistance state. Note that, in FIGS. 7A to 7C, the selection transistor 23 is illustrated as a switch indicating an on or off state. In addition, in this example, the resistance value Ron of the selection transistor 23 in the on state is set to 150[Ω], the resistance value of each of the memory elements 21A and 21B in the high-resistance state is set to 10,000 [kΩ], the resistance value Rtrm in the low resistance state is set to 1 [kΩ], and the resistance value R of each of the resistors 22A and 22B is set to 3 k [Ω].

In the reading operation, the bit line driving section 12 sets the voltage VBL of the bit line BL to 0 V, and the sense amplifier 13 sets the voltage VSL of the source line SL to the voltage VR. This generates the reading current IR corresponding to the resistance state in the memory elements 21A and 21B, in the memory cell 20. The sense amplifier 13 detects the reading current IR, thereby reading the information held by the memory cell 20.

In the case C1, as illustrated in FIG. 7A, the total value of the resistance value of the memory element 21A and the resistance value of the resistor 22A is 10,003 [kΩ] (=10,000 [kΩ]+3 [kΩ]), and the total value of the resistance value of the memory element 21B and the resistance value of the resistor 22B is 10,003 [kΩ] (=10,000 [kΩ]+3 [kΩ]). Therefore, the resistance value of the entire memory cell 20 is 5,003 [kΩ]. The reading current IR corresponding to the resistance value flows through the memory cell 20. In a case where the voltage VR is 1.8 V, the value of the reading current IR is 0.4 [μA] (=1.8 [V]/5,003 [kΩ]).

In the case C2, as illustrated in FIG. 7B, the total value of the resistance value of the memory element 21A and the resistance value of the resistor 22A is 4 [kΩ] (=1 [kΩ]+3 [kΩ]), and the total value of the resistance value of the memory element 21B and the resistance value of the resistor 22B is 10,003 [kΩ] (=10000 [kΩ]+3 [kΩ]). Therefore, the resistance value of the entire memory cell 20 is 5 [kΩ)]. In the case where the voltage VR is 1.8 V, the value of the reading current IR is 360 [μA] (=1.8 [V]/5 [kΩ]). In other words, in this example, the value of the reading current IR in the case C2 is about 1,000 times the value of the reading current IR in the case C1.

In the case C3, as illustrated in FIG. 7C, the total value of the resistance value of the memory element 21A and the resistance value of the resistor 22A is 4 [kΩ] (=1 [kΩ]+3 [kΩ]), and the total value of the resistance value of the memory element 21B and the resistance value of the resistor 22B is 4 [kΩ] (=1 [kΩ]+3 [kΩ]). Therefore, the resistance value of the entire memory cell 20 is 3 [kΩ]. In the case where the voltage VR is 1.8 V, the value of the reading current IR is 600 [μA] (=1.8 [V]/3 [kΩ]). In other words, in this example, the value of the reading current IR in the case C3 is about 1,000 times the value of the reading current IR in the case C1.

FIG. 8 is a diagram illustrating the reading current IR in each of the cases C1 to C3. As illustrated in FIG. 8, in the cases C2 and C3, the reading current IR is larger than that in the case C1. Therefore, the sense amplifier 13 sets a threshold current Ith in a range between the reading current IR in the case C1 and the reading currents IR of the respective cases C2 and C3, and compares the reading current IR with the threshold current Ith, thereby reading the information written into the memory cell 20. This makes it possible to determine whether both the memory elements 21A and 21B is in the high-resistance state (the case C1), or the memory element 21A or the memory element 21B or both are in the low-resistance state (the case C2 or C3), in the memory apparatus 1. In other words, in the memory apparatus 1, even in a case where only one of the memory elements 21A and 21B is put into the low-resistance state for some reasons in the writing operation as with the case C2, or even in a case where one of the memory elements 21A and 21B is put into the open state for some reasons after the normal writing operation, the reading current IR exceeds the threshold current Ith as with the case where the normal writing operation is performed (the case C3). As mentioned above, since the memory apparatus 1 has the redundancy, it is possible to reduce possibility of data loss even if an unexpected situation occurs.

In addition, since the memory element 21A and the memory element 21B are coupled in parallel to each other through the resistors 22A and 22B in the memory apparatus 1, it is possible to simplify the configuration. In other words, as the memory apparatus having redundancy, for example, a memory cell may be configured using one memory element and one selection transistor to store same information in two memory cells. It is, however, necessary for the configuration to include a determination circuit determining that the writing operation is performed on one or both of the two memory cells, on the basis of the information read out from the two memory cells. Accordingly, the configuration may become complicated and the size of the memory apparatus may be increased in this case. In contrast, since the memory element 21A and the memory element 21B are coupled in parallel to each other through the resistors 22A and 22B in the memory apparatus 1, the entire memory cell 20 is in the low-resistance state in a case where the memory element 21 or the memory element 21B or both are in the low-resistance state. This makes it possible to eliminate the determination circuit, which allows for simplification of the configuration and size reduction of the memory apparatus 1.

Size of Memory Apparatus 1

FIG. 9 is a diagram illustrating relationship between the size of the memory apparatus and a bit number of data storable in the memory apparatus. As illustrated in FIG. 9, in the memory apparatus, the number of memory cells is typically increased and the size of the entire memory apparatus becomes larger as the bit number is increased. Therefore, in the memory apparatus having a large bit number, an area ratio of the memory cell array in the entire memory apparatus is large. Further, in the memory apparatus having a small bit number, the area ratio of a portion (including the bit line driving section, the word line driving section, and the sense amplifier) other than the memory cell array in the entire memory apparatus is large.

As mentioned above, since the peak value of the writing current IW flowing through the memory cell 20 is suppressed in the memory apparatus 1, it is possible to reduce the size of each of the selection transistor 25 (the memory cell array 10), the bit line driving section 12, and the sense amplifier 13. Furthermore, since the memory element 21A and the memory element 21B are coupled in parallel to each other through the resistors 22A and 22B in the memory apparatus 1, it is possible to eliminate the determination circuit. As mentioned above, it is possible for the memory apparatus 1 to reduce the size of the memory cell array 10 and the size of the portion other than the memory cell array 10. This makes it possible for the memory apparatus 1 to reduce the size of the entire memory apparatus even in a case where the storable bit number is large or small.

Effects

As described above, since the thresholds of the respective memory elements 21A and 21B are made different from each other in the present embodiment, it is possible to suppress the peak value of the writing current and to reduce the size of each of the selection transistor, the bit line driving section, and the sense amplifier. As a result, it is possible to reduce the size of the entire memory apparatus.

In the present embodiment, since the memory element 21A and the memory element 21B are coupled in parallel to each other through the resistors 22A and 22B, it is possible to eliminate the determination circuit, which allows for simplification of the configuration and size reduction of the entire memory apparatus.

In the present embodiment, since the resistor is coupled to the memory element having the lower threshold out of the two memory elements, it is possible to facilitate formation of the filament in the memory element having the higher threshold.

Modification 1-1

In the above-described embodiment, the two resistors 22A and 22B are provided in the memory cell 20; however, the configuration is not limited thereto, and for example, the resistor 22B may be omitted as with a memory cell 20A illustrated in FIG. 10. In this case, the other end of the memory element 21B is coupled to the other end of the resistor 22A and the drain of the selection transistor 23. Such a configuration also makes it possible to achieve effects equivalent to those of the memory cell 20 according to the above-described embodiment.

Modification 1-2

In the above-described embodiment, the memory element 21A, the resistor 22A, and the selection transistor 23 are coupled in this order, and the memory element 21B, the resistor 22B, and the selection transistor 23 are coupled in this order. The coupling order, however, is not limited thereto. Alternatively, as with a memory cell 20B illustrated in FIG. 10, for example, the memory element 21A and the resistor 22A may be replaced with each other, and the memory element 21B and the resistor 22B may be replaced with each other. In the memory cell 20B, the one end of the resistor 22A is coupled to the one end of the resistor 22B and the bit line BL, and the other end of the resistor 22A is coupled to the one end of the memory element 21A. The one end of the resistor 22B is coupled to the one end of the resistor 22A and the bit line BL, and the other end of the resistor 22B is coupled to the one end of the memory element 21B. The one end of the memory element 21A is coupled to the other end of the resistor 22A, and the other end of the memory element 21A is coupled to the other end of the memory element 21B and the drain of the selection transistor 23. The one end of the memory element 21B is coupled to the other end of the resistor 22B, and the other end of the memory element 21B is coupled to the other end of the memory element 21A and the drain of the selection transistor 23.

Modification 1-3

In the above-described embodiment, the memory apparatus 1 has the SOI configuration as illustrated in FIG. 3A; however, the configuration is not limited thereto. FIG. 12 is a diagram illustrating an example of a cross-sectional configuration of a main part of a memory element 31 in a memory apparatus 1C according to the present modification. FIG. 12 illustrates the memory element 31 in the high-resistance state, which corresponds to FIG. 3A according to the above-described embodiment. The memory element 31 is provided in a region surrounded by the device separation insulation layer 102, on the P-type semiconductor substrate 100P. The memory element 31 includes a semiconductor layer 210P. The semiconductor layer 210P is a P-type semiconductor layer provided on a surface of the P-type semiconductor substrate 100P and configures so-called P-well. The semiconductor layer 210P functions as a so-called back gate of the memory element 31. The semiconductor layers 111N and 112N are provided in the semiconductor layer 210P, as with the memory apparatus 1 (FIG. 3A) according to the above-described embodiment.

Modification 1-4

In the above-described embodiment, the two memory elements 21A and 21B that have the thresholds different from each other are coupled in parallel to each other; however, the number of memory elements is not limited thereto. For example, three or more memory elements that have thresholds different from one another may be coupled in parallel to one another. In this case, a resistor may be coupled in series to each of the memory elements as with, for example, FIG. 2, or a resistor may be coupled in series to a memory element other than a memory element having the largest threshold as with FIG. 10.

Other Modifications

Moreover, two or more of the modifications may be combined.

2. Second Embodiment

Next, a memory apparatus 2 according to a second embodiment is described. The memory apparatus 2 stores a plurality of pieces of bit data in each memory cell. Note that components substantially same as those of the memory apparatus 1 according to the above-described first embodiment are denoted by the same reference numerals, and description of the components is appropriately omitted.

FIG. 13 is a diagram illustrating a configuration example of the memory apparatus 2 according to the present embodiment. The memory apparatus 2 includes a memory cell array 40 and a bit line driving section 42.

The memory cell array 40 includes a plurality of memory cells 50 that are arranged in a matrix. Further, the memory cell array 40 includes a plurality of word lines WL extending in a row direction (a lateral direction), and a plurality of bit lines BLA and BLB and a plurality of source lines SL that extend in a column direction (a vertical direction). One end of each of the bit lines BLA and BLB is coupled to the bit line driving section 42. Each of the memory cells 50 is coupled to the word line WL, the bit lines BLA and BLB, and the source line SL.

FIG. 14 is a diagram illustrating a configuration example of the memory cell 50. The memory cell 50 includes the memory elements 21A and 21B, the resistors 22A and 22B, and the selection transistor 23. The one end of the memory element 21A is coupled to the bit line BLA, and the other end of the memory element 21A is coupled to the one end of the resistor 22A. The one end of the memory element 21B is coupled to the bit line BLB, and the other end of the memory element 21B is coupled to the one end of the resistor 22B. The threshold VthA of the memory element 21A is set lower than the threshold VthB of the memory element 21B, as with the first embodiment.

The bit line driving section 42 drives the bit lines BLA and BLB, thereby controlling the writing operation and the reading operation in the memory cell array 40.

More specifically, in the writing operation, the bit line driving section 42 sets a voltage VBLA of the bit line BLA to a positive voltage VW (VW>0), thereby selecting the memory element 21A of the memory cell 50 that is an object of the writing operation in the selected one row, and applying the stress voltage to the memory element 21A. Likewise, the bit line driving section 42 sets a voltage VBLB of the bit line BLB to the positive voltage VW (VW>0), thereby selecting the memory element 21B of the memory cell 50 that is an object of the writing operation in the selected one row, and applying the stress voltage to the memory element 21B.

In addition, in the reading operation, the bit line driving section 42 sets the voltage VBLA of the bit line BLA to 0 V and puts the bit line BLB into a floating state, thereby selecting the memory element 21A of the memory cell 50 that is an object of the reading operation in the selected one row. Likewise, the bit line driving section 42 puts the bit line BLA into a floating state and sets the voltage VBLB of the bit line BLB to 0 V, thereby selecting the memory element 21B of the memory cell 50 that is an object of the reading operation, in the selected one row.

FIGS. 15A to 15C are diagrams each illustrating the writing operation on the memory cell 50, where FIG. 15A illustrates a case where the writing operation is performed only on the memory element 21A, FIG. 15B illustrates a case where the writing operation is performed only on the memory element 21B, and FIG. 15C illustrates a case where the writing operation is performed on both of the memory elements 21A and 21B.

In the case where the writing operation is performed only on the memory element 21A, the sense amplifier 13 sets the voltage VSL of the source line SL to 0 V, and the bit line driving section 42 sets the voltage VBLA of the bit line BLA to the voltage VW and sets the voltage VBLB of the bit line BLB to 0 V, as illustrated in FIG. 15A. This causes the writing current IWA to flow through the memory element 21A, the resistor 22A, and the selection transistor 23 in order, and changes the resistance state of the memory element 21A from the high-resistance state to the low-resistance state, in the memory cell 50.

Likewise, in the case where the writing operation is performed only on the memory element 21B, the sense amplifier 13 sets the voltage VSL of the source line SL to 0 V, and the bit line driving section 42 sets the voltage VBLA of the bit line BLA to 0V and sets the voltage VBLB of the bit line BLB to the voltage VW, as illustrated in FIG. 15B. This causes the writing current IWB to flow through the memory element 21B, the resistor 22B, and the selection transistor 23 in order, and changes the resistance state of the memory element 21B from the high-resistance state to the low-resistance state, in the memory cell 50.

In contrast, in the case where the writing operation is performed on both of the memory elements 21A and 21B, the sense amplifier 13 sets the voltage VSL of the source line SL to 0 V, and the bit line driving section 42 sets the voltages VBLA and VBLB of the respective bit lines BLA and BLB to the voltage VW, as illustrated in FIG. 15C. As a result, as with the memory cell 20 according to the first embodiment, the large writing current IWA first flows through the memory element 21A, the resistor 22A, and the selection transistor 23, and the resistance state of the memory element 21A is changed from the high-resistance state to the low-resistance state, in the memory cell 50. Thereafter, the large writing current IWB flows through the memory element 21B, the resistor 22B, and the selection transistor 23 in order, and the resistance state of the memory element 21B is changed from the high-resistance state to the low-resistance state.

As mentioned above, in the memory apparatus 2, since the bit lines BLA and BLB are provided, the one end of the memory element 21A is coupled to the bit line BLA, and the one end of the memory element 21B is coupled to the bit line BLB, it is possible to store two pieces of bit data in the memory cell 50.

In particular, in the memory apparatus 2, it is possible to perform the writing operation in one cycle in the case where the writing operation is performed on both of the memory elements 21A and 21B. At this time, since the threshold VthA of the memory element 21A is made different from the threshold VthB of the memory element 21B, it is possible to shift the timing t1 at which the large writing current IWA flows through the memory element 21A from the timing t2 at which the large writing current IWB flows through the memory element 21B. As a result, it is possible to suppress the peak value of the writing current IW (=IWA+IWB) flowing through the selection transistor 23, which allows for size reduction of the selection transistor 23. Further, it is possible to reduce the size of the sense amplifier 13 that sinks the writing current IW.

FIGS. 16A and 16B are diagrams each illustrating the reading operation on the memory cell 50, where FIG. 16A illustrates a case where the reading operation is performed on the memory element 21A, and FIG. 16B illustrates a case where the reading operation is performed on the memory element 21B.

In the case where the reading operation is performed on the memory element 21A, as illustrated in FIG. 16A, the bit line driving section 42 sets the voltage VBLA of the bit line BLA to 0 V and puts the bit line BLB into a floating state, and the sense amplifier 13 sets the voltage VSL of the source line SL to the voltage VR. This causes the reading current IR to flow through the selection transistor 23, the resistor 22A, and the memory element 21A in order in the memory cell 50. The sense amplifier 13 detects the reading current IR, thereby reading the information held by the memory element 21A of the memory cell 50.

In the case where the reading operation is performed on the memory element 21B, as illustrated in FIG. 16B, the bit line driving section 42 puts the bit line BLA into the floating state and sets the voltage VBLB of the bit line BLB to 0 V, and the sense amplifier 13 sets the voltage VSL of the source line SL to the voltage VR. This causes the reading current IR to flow through the selection transistor 23, the resistor 22B, and the memory element 21B in order in the memory cell 50. The sense amplifier 13 detects the reading current IR, thereby reading the information held by the memory element 21B of the memory cell 50.

As mentioned above, in the present embodiment, since the bit lines BLA and BLB are provided, the one end of the memory element 21A is coupled to the bit line BLA, and the one end of the memory element 21B is coupled to the bit line BLB, it is possible to store two pieces of bit data in each memory cell. Other effects are similar to those in the above-described first embodiment.

Modification 2-1

In the above-described embodiment, the memory cell 50 is configured with use of the two memory elements 21A and 21B; however, the number of memory elements is not limited thereto, and the memory cell may be configured with use of three or more memory elements. An example in which the memory cell is configured with use of three memory elements is described in detail below.

FIG. 17 is a diagram illustrating a configuration example of a memory apparatus 2A according to the present embodiment. The memory apparatus 2A includes a memory cell array 40A and a bit line driving section 42A.

The memory cell array 40A includes a plurality of memory cells 50A that are arranged in a matrix. In addition, the memory cell array 40A includes a plurality of bit lines BLA, BLB, and BLC that extend in a column direction (a vertical direction). One end of each of the bit lines BLA, BLB, and BLC is coupled to the bit line driving section 42A. Each of the memory cells 50A is coupled to the word line WL, the bit lines BLA, BLB, and BLC, and the source line SL.

FIG. 18 is a diagram illustrating a configuration example of each of the memory cells 50A. Each of the memory cell 50A includes memory elements 21A, 21B, and 21C, and resistors 22A, 22B, and 22C. The one end of the memory element 21A is coupled to the bit line BLA, and the other end of the memory element 21A is coupled to the one end of the resistor 22A. The one end of the memory element 21B is coupled to the bit line BLB, and the other end of the memory element 21B is coupled to the one end of the resistor 22B. One end of the memory element 21C is coupled to the bit line BLC, and the other end of the memory element 21C is coupled to one end of the resistor 22C. The one end of the resistor 22A is coupled to the other end of the memory element 21A, and the other end of the resistor 22A is coupled to the other ends of the respective resistors 22B and 22C and the drain of the selection transistor 23. The one end of the resistor 22B is coupled to the other end of the memory element 22A, and the other end of the resistor 22B is coupled to the other ends of the respective resistors 22A and 22C and the drain of the selection transistor 23. The one end of the resistor 22C is coupled to the other end of the memory element 21C, and the other end of the resistor 22C is coupled to the other ends of the respective resistors 22A and 22B and the drain of the selection transistor 23. The threshold VthA of the memory element 21A is set lower than the threshold VthB of the memory element 21B, and the threshold VthB of the memory element 21B is set lower than a threshold VthC of the memory element 21C.

The bit line driving section 42A drives the bit lines BLA, BLB, and BLC, thereby controlling the writing operation and the reading operation in the memory cell array 40A, as with the bit line driving section 42 according to the above-described embodiment.

Note that the three resistors 22A to 22C are provided in this example; however, the configuration is not limited thereto. For example, as with a memory cell 50B illustrated in FIG. 18, the resistor 22C coupled to the memory element 21C that has the highest threshold out of the memory elements 21A to 2C, may be omitted.

Modification 2-2

In the above-described embodiment, the bit line driving section 42 concurrently sets the voltage VBLA of the bit line BLA and the voltage VBLB of the bit line BLB to the voltage VW in the case where the writing operation is performed on the two memory elements 21A and 2B; however, the configuration is not limited thereto, and for example, the voltage setting timings may be shifted from each other. In this case, the thresholds Vth of the respective memory elements 21A and 21B may be made different from each other or made equal to each other. An operation example in a case where the thresholds Vth of the respective memory elements 21A and 21B are made equal to each other in a memory apparatus 2C according to the present modification is described below.

FIG. 20 is a diagram illustrating an example of the writing operation on a memory cell 50C of the memory apparatus 2C. In the case where the writing operation is performed on both of the memory elements 21A and 21B, a bit line driving section 42C of the memory apparatus 2C first sets the voltage VBLA of the bit line BLA to the voltage VW, and then sets the voltage VBLB of the bit line BLB to the voltage VW. At this time, the voltage VBLA is varied with a time constant corresponding to the resistance component of the bit line BLA itself and the load, and the voltage VBLB is similarly varied with a time constant corresponding to the resistance component of the bit line BLB itself and the load. When the voltage VBLA of the bit line BLA reaches the threshold Vth at timing t11, the large current IWA flows, and the resistance state of the memory element 21A is changed from the high-resistance state to the low-resistance state. Likewise, when the voltage VBLB of the bit line BLB reaches the threshold Vth at timing t12, the large writing current IWB flows, and the resistance state of the memory element 21B is changed from the high-resistance state to the low-resistance state. Such a configuration also makes it possible to achieve effects equivalent to the effects of the memory cell 20 according to the above-described embodiment.

Note that the two resistors 22A and 22B are provided in this example; however, the configuration is not limited thereto, and for example, the resistor 22B led to the bit line BLB, the voltage of which is set later, may be omitted.

Hereinbefore, although the present technology has been described with reference to some embodiments and modifications, the present technology is not limited to the embodiments and the modifications, and may be variously modified.

For example, in the above-described respective embodiments, the configuration of each of the memory elements 21A, 21B, etc. is not limited to the configuration illustrated in FIG. 3, and an anti-fuse having an optional configuration, for example, an anti-fuse disclosed in each of PTLs 1 and 2, is adoptable.

Note that the effects described in the present specification are illustrative and non-limiting. Effects achieved by the technology may be effects other than those described above.

Note that the present technology may be configured as follows.

(1) A memory cell, including:
anti-fuses that are respectively inserted into a plurality of paths, one ends of the respective plurality of paths being coupled to one another;
a resistor that is inserted into one or more of the plurality of paths; and
a selection transistor that is turned on to couple a first coupling terminal to the one ends of the respective plurality of paths.

(2) The memory cell according to (1), in which
each of the anti-fuses has a first terminal and a second terminal,
a resistance state of each of the anti-fuses is changed from a high-resistance state to a low-resistance state when a potential difference between the first terminal and the second terminal of relevant one of the anti-fuses exceeds a predetermined threshold, and
the thresholds of the respective plurality of anti-fuses are different from one another.

(3) The memory cell according to (2), in which the one or more of the plurality of paths is a path into which any of the anti-fuses having a lowest threshold is inserted.

(4) The memory cell according to (2), in which the resistor is inserted into each of the plurality of paths.

(5) The memory cell according to any one of (2) to (4), further including a single second coupling terminal that is coupled to other ends of the respective plurality of paths.

(6) The memory cell according to any one of (2) to (4), further including a plurality of second coupling terminals that are coupled to respective other ends of the respective plurality of paths.

(7) The memory cell according to (6), in which the resistance state of each of the anti-fuses is changed from the high-resistance state to the low-resistance state in response to application of a stress voltage to the plurality of second coupling terminals at same timing.

(8) The memory cell according to any one of (2) to (7), in which
the resistance state of each of the anti-fuses is changed from the high-resistance state to the low-resistance state, on a basis of heat generation that is caused by a current flowing between the first terminal and the second terminal of relevant one of the anti-fuses, and
heat dissipation properties of the respective anti-fuses are different from one another.

(9) The memory cell according to any one of (2) to (8), in which
each of the anti-fuses includes
a first semiconductor layer of a first electroconductive type,
a second semiconductor layer of a second electroconductive type, the second semiconductor layer being coupled to the first terminal of the anti-fuse and being provided on a surface of the first semiconductor layer,
a third semiconductor layer of the second electroconductive type, the third semiconductor layer being coupled to the second terminal of the anti-fuse and being provided, on the surface of the first semiconductor layer, separately from the second semiconductor layer, and
a dielectric film being provided on the surface of the first semiconductor layer in a separation region between the second semiconductor layer and the third semiconductor layer.

(10) The memory cell according to (9), in which each of the anti-fuses further includes a first electroconductive film provided on the dielectric film.

(11) The memory cell according to (9) or (10), in which the first semiconductor layer is provided on a surface of a substrate and is surrounded by an insulation layer inside the substrate.

(12) The memory cell according to any one of (9) to (11), in which
each of the anti-fuses further includes
a second electroconductive film being coupled to the second semiconductor layer, and
a third electroconductive film being coupled to the third semiconductor layer, and
the anti-fuses are different in an area of the second electroconductive film or an area of the third electroconductive film or both, from one another.

(13) The memory cell according to any one of (9) to (12), in which the anti-fuses are different in a volume of the first semiconductor layer, from one another.

(14) The memory cell according to any one of (9) to (13), in which the anti-fuses are different in a distance between the second semiconductor layer and the third semiconductor layer, from one another.

(15) The memory cell according to (1), further including a plurality of second coupling terminals that are coupled to respective other ends of the respective plurality of paths, in which
a resistance state of each of the anti-fuses is changed from a high-resistance state to a low-resistance state in response to application of a stress voltage to the plurality of second coupling terminals at different timings.

(16) The memory cell according to (15), in which the one or more of the plurality of paths is a path to which the stress voltage is applied at earliest timing.

(17) A memory apparatus, including:
a memory cell; and
a control section that controls the memory cell,
in which the memory cell includes
anti-fuses that are respectively inserted into a plurality of paths, one ends of the respective plurality of paths being coupled to one another,
a resistor that is inserted into one or more of the plurality of paths, and
a selection transistor that is turned on to couple a first coupling terminal to the one ends of the respective plurality of paths.

(18) The memory apparatus according to (17), in which
the memory cell further includes a single second coupling terminal that is coupled to other ends of the respective plurality of paths,
each of the anti-fuses includes a first terminal and a second terminal,
a resistance state of each of the anti-fuses is changed from a high-resistance state to a low-resistance state when a potential difference between the first terminal and the second terminal of relevant one of the anti-fuses exceeds a predetermined threshold,
the thresholds of the respective plurality of anti-fuses are different from one another, and the control section applies a stress voltage to the second coupling terminal to change the resistance state of each of the plurality of anti-fuses from the high-resistance state to the low-resistance state.

(19) The memory apparatus according to (17), in which the memory cell further includes a plurality of second coupling terminals that are respectively coupled to respective other ends of the respective plurality of paths, each of the anti-fuses includes a first terminal and a second terminal, a resistance state of each of the anti-fuses is changed from a high-resistance state to a low-resistance state when a potential difference between the first terminal and the second terminal of relevant one of the anti-fuses exceeds a predetermined threshold, the thresholds of the respective plurality of anti-fuses are different from one another, and the control section applies a stress voltage to the plurality of second coupling terminals at same timing to change the resistance state of each of the plurality of anti-fuses from the high-resistance state to the low-resistance state.

(20) The memory apparatus according to (17), in which the memory cell further includes a plurality of second coupling terminals that are coupled to respective other ends of the respective plurality of paths, and the control section applies a stress voltage to the plurality of second coupling terminals at different timings to change a resistance state of each of the plurality of anti-fuses from a high-resistance state to a low-resistance state.

This application is based upon and claims the benefit of priority of the Japanese Patent Application No. 2015-8603 filed in the Japan Patent Office on Jan. 20, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory cell, comprising:
a plurality of anti-fuses in a plurality of paths, wherein a first end of a first path of the plurality of paths is coupled to a first end of a second path of the plurality of paths;
a first resistor in the first path;
a second resistor in the second path; and
a selection transistor configured to turn on to couple a first coupling terminal to each of the first end of the first path and the first end of the second path, wherein
a first end of the first resistor is coupled to a first anti-fuse of the plurality of anti-fuses in the first path,
a second end of the first resistor is coupled to the selection transistor,
a first end of the second resistor in the second path is coupled to a second anti-fuse of the plurality of anti-fuses in the second path, and
a second end of the second resistor in the second path is coupled to the selection transistor and the second end of the first resistor.

2. The memory cell according to claim 1, wherein
each of the plurality of anti-fuses includes a first terminal and a second terminal,
a change in a resistance state of each of the plurality of anti-fuses from a high-resistance state to a low-resistance state is based on a potential difference between the first terminal and the second terminal of one of the plurality of anti-fuses that exceeds a specific threshold value, and
the specific threshold value of each of the plurality of anti-fuses is different from one another.

3. The memory cell according to claim 2, wherein the specific threshold value of the first anti-fuse in the first path is lower than the specific threshold value of the second anti-fuse in the second path.

4. The memory cell according to claim 2, further comprising a single second coupling terminal coupled to each of a second end of the first path and a second end of the second path.

5. The memory cell according to claim 2, further comprising a plurality of second coupling terminals coupled to a plurality of second ends of the plurality of paths.

6. The memory cell according to claim 5, wherein the change in the resistance state of each of the plurality of anti-fuses from the high-resistance state to the low-resistance state is based on an application of a stress voltage to each of the plurality of second coupling terminals at a same time.

7. The memory cell according to claim 2, wherein
the change in the resistance state of each of the plurality of anti-fuses from the high-resistance state to the low-resistance state is based on heat generation by a flow of current between the first terminal of one of the plurality of anti-fuses and the second terminal of the one of the plurality of anti-fuses, and
heat dissipation properties of each of the plurality of anti-fuses is different from one another.

8. The memory cell according to claim 2, wherein
each of the plurality of anti-fuses includes:
a first semiconductor layer of a first electroconductive type;
a second semiconductor layer of a second electroconductive type on a surface of the first semiconductor layer, wherein the second semiconductor layer is coupled to the first terminal;
a third semiconductor layer of the second electroconductive type on the surface of the first semiconductor layer, wherein the third semiconductor layer is coupled to the second terminal, and wherein a position of the third semiconductor layer on the surface of the first semiconductor layer is different from a position of the second semiconductor layer on the surface of the first semiconductor layer; and
a dielectric film on the surface of the first semiconductor layer in a separation region between the second semiconductor layer and the third semiconductor layer.

9. The memory cell according to claim 8, wherein each of the plurality of anti-fuses further includes a first electroconductive film on the dielectric film.

10. The memory cell according to claim 8, wherein the first semiconductor layer is on a substrate, and wherein the first semiconductor layer is surrounded by an insulation layer.

11. The memory cell according to claim 8, wherein
each of the plurality of anti-fuses further includes:
a second electroconductive film coupled to the second semiconductor layer; and
a third electroconductive film coupled to the third semiconductor layer,
the first anti-fuse is different from the second anti-fuse based on at least one of:

an area of the second electroconductive film of the first anti-fuse that is different from an area of the second electroconductive film of the second anti-fuse, or an area of the third electroconductive film of the first anti-fuse that is different from an area of the third electroconductive film of the second anti-fuse.

12. The memory cell according to claim 8, wherein a volume of the first semiconductor layer of the first anti-fuse is different from a volume of the first semiconductor layer of the second anti-fuse.

13. The memory cell according to claim 8, wherein a distance between the second semiconductor layer of the first anti-fuse and the third semiconductor layer of the first anti-fuse is different from a distance between the second semiconductor layer of the second anti-fuse and the third semiconductor layer of the second anti-fuse.

14. The memory cell according to claim 1, further comprising a plurality of second coupling terminals coupled to a plurality of second ends of the plurality of paths, wherein a change in a resistance state of each of the plurality of anti-fuses from a high-resistance state to a low-resistance state is based on an application of a stress voltage to the plurality of second coupling terminals at different timings.

15. The memory cell according to claim 14, wherein the application of the stress voltage to the first path is prior to the application of the stress voltage to the plurality of paths other than the first path.

16. A memory apparatus, comprising:
  a memory cell; and
  a control section configured to control the memory cell, wherein the memory cell includes:
    a plurality of anti-fuses in a plurality of paths, wherein a first end of a first path of the plurality of paths is coupled to a first end of a second path of the plurality of paths;
    a first resistor in the first path;
    a second resistor in the second path; and
    a selection transistor configured to turn on to couple a first coupling terminal to each of the first end of the first path and the first end of the second path, wherein
    a first end of the first resistor is coupled to a first anti-fuse of the plurality of anti-fuses in the first path,
    a second end of the first resistor is coupled to the selection transistor,
    a first end of the second resistor in the second path is coupled to a second anti-fuse of the plurality of anti-fuses in the second path, and
    a second end of the second resistor in the second path is coupled to the selection transistor and the second end of the first resistor.

17. The memory apparatus according to claim 16, wherein the memory cell further includes a single second coupling terminal coupled to each of a second end of the first path and a second end of the second path,
each of the plurality of anti-fuses includes a first terminal and a second terminal,
a change in a resistance state of each of the plurality of anti-fuses from a high-resistance state to a low-resistance state is based on a potential difference between the first terminal and the second terminal of one of the plurality of anti-fuses that exceeds a specific threshold value,
the specific threshold value of each of the plurality of anti-fuses is different from one another, and
the control section is further configured to:
  apply a stress voltage to the single second coupling terminal; and
  change the resistance state of each of the plurality of anti-fuses from the high-resistance state to the low-resistance state based on the application of the stress voltage.

18. The memory apparatus according to claim 16, wherein the memory cell further includes a plurality of second coupling terminals coupled to a plurality of second ends of the plurality of paths,
each of the plurality of anti-fuses includes a first terminal and a second terminal,
a change in a resistance state of each of the plurality of anti-fuses from a high-resistance state to a low-resistance state is based on a potential difference between the first terminal and the second terminal of one of the plurality of anti-fuses that exceeds a specific threshold value,
the specific threshold value of each of the plurality of anti-fuses is different from one another, and
the control section is further configured to:
  apply a stress voltage to the plurality of second coupling terminals at a same time; and
  change the resistance state of each of the plurality of anti-fuses from the high-resistance state to the low-resistance state based on the application of the stress voltage.

19. The memory apparatus according to claim 16, wherein the memory cell further includes a plurality of second coupling terminals coupled to a plurality of second ends of the plurality of paths, and
the control section is further configured to:
  apply a stress voltage to the plurality of second coupling terminals at different timings; and
  change a resistance state of each of the plurality of anti-fuses from a high-resistance state to a low-resistance state based on the application of the stress voltage.

* * * * *